US008546255B2

(12) United States Patent
Wang

(10) Patent No.: US 8,546,255 B2
(45) Date of Patent: Oct. 1, 2013

(54) METHOD FOR FORMING VIAS IN A SEMICONDUCTOR SUBSTRATE AND A SEMICONDUCTOR DEVICE HAVING THE SEMICONDUCTOR SUBSTRATE

(75) Inventor: Meng-Jen Wang, Kaohsiung (TW)

(73) Assignee: Advanced Semiconductor Engineering, Inc., Kaohsuing (TW)

( * ) Notice: Subject to any disclaimer, the term of this patent is extended or adjusted under 35 U.S.C. 154(b) by 120 days.

(21) Appl. No.: 12/849,692

(22) Filed: Aug. 3, 2010

(65) Prior Publication Data
US 2010/0297843 A1    Nov. 25, 2010

Related U.S. Application Data

(63) Continuation-in-part of application No. 12/183,140, filed on Jul. 31, 2008, now Pat. No. 7,816,265.

(30) Foreign Application Priority Data

Aug. 2, 2007 (TW) .............................. 96128415 A

(51) Int. Cl.
H01L 21/768 (2006.01)
(52) U.S. Cl.
USPC ................... 438/667; 257/621; 257/E21.577; 257/E21.597; 257/E23.174; 438/669; 438/672
(58) Field of Classification Search
USPC ........... 257/621, E21.577, E21.597, E23.174; 438/667, 669, 672
See application file for complete search history.

(56) References Cited

U.S. PATENT DOCUMENTS

| 5,308,443 | A | 5/1994 | Sugihara |
| 5,998,292 | A | 12/1999 | Black et al. |
| 6,700,175 | B1 | 3/2004 | Kodama et al. |
| 6,809,421 | B1 | 10/2004 | Hayasaka et al. |
| 7,222,420 | B2 | 5/2007 | Moriizumi |
| 7,276,787 | B2 | 10/2007 | Edelstein et al. |
| 7,772,116 | B2 | 8/2010 | Akram et al. |
| 2003/0176058 | A1 | 9/2003 | Weidman et al. |
| 2004/0259292 | A1 | 12/2004 | Beyne et al. |
| 2006/0001174 | A1 | 1/2006 | Matsui |
| 2006/0118965 | A1 | 6/2006 | Matsui |

(Continued)

FOREIGN PATENT DOCUMENTS

| CN | 1684256 | 10/2005 |
| CN | 101281883 | 10/2008 |

(Continued)

OTHER PUBLICATIONS

Office Action in U.S. Appl. No. 12/241,219 dated Jan. 13, 2011.

(Continued)

*Primary Examiner* — Peniel M Gumedzoe
(74) *Attorney, Agent, or Firm* — McCracken & Frank LLC

(57) ABSTRACT

The present invention relates to a method for forming vias in a semiconductor substrate, including the following steps: (a) providing a semiconductor substrate having a first surface and a second surface; (b) forming a groove on the semiconductor substrate; (c) filling the groove with a conductive metal; (d) removing part of the semiconductor substrate which surrounds the conductive metal, wherein the conductive metal is maintained so as to form an accommodating space between the conductive metal and the semiconductor substrate; and (e) forming an insulating material in the accommodating space. In this way, thicker insulating material can be formed in the accommodating space, and the thickness of the insulating material in the accommodating space is even.

30 Claims, 23 Drawing Sheets

(56) References Cited

U.S. PATENT DOCUMENTS

| | | |
|---|---|---|
| 2006/0281307 A1 | 12/2006 | Trezza |
| 2007/0048896 A1 | 3/2007 | Andry et al. |
| 2007/0184654 A1 | 8/2007 | Akram et al. |
| 2008/0041621 A1 | 2/2008 | Hsu et al. |
| 2008/0164573 A1 | 7/2008 | Basker et al. |

FOREIGN PATENT DOCUMENTS

| | | |
|---|---|---|
| JP | 2005219588 | 8/2005 |
| JP | 2007036060 | 2/2007 |
| TW | 200416897 | 9/2004 |
| TW | 200501386 | 1/2005 |
| TW | I239594 | 9/2005 |
| TW | 200707667 | 2/2007 |
| TW | 200715438 | 4/2007 |
| TW | I278263 | 4/2007 |
| TW | 200926259 | 6/2009 |

OTHER PUBLICATIONS

Office Action dated Jan. 4, 2012, with abstract for counterpart CN Patent Application No. 2010101444216.7 (8 pages).

United States Patent Office Final Office Action issued Jul. 11, 2012 for U.S. Appl. No. 13/085,311, Applicants, Meng-Jen Wang et al. (18 pages).

TIPO Office Action dated Apr. 10, 2013 for TW Patent Application No. 098146109, Applicant Advanced Semiconductor Engineering, Inc., with English translation (7 pages).

METHOD FOR FORMING VIAS IN A SEMICONDUCTOR SUBSTRATE AND A SEMICONDUCTOR DEVICE HAVING THE SEMICONDUCTOR SUBSTRATE

CROSS-REFERENCE TO RELATED APPLICATION

This is a continuation-in-part of U.S. application Ser. No. 12/183,140, filed Jul. 31, 2008, entitled "Method for forming vias in a substrate," which claims priority from Taiwan patent application number 096128415, filed Aug. 2, 2007, both of which are incorporated by reference herein.

BACKGROUND OF THE INVENTION

1. Field of the Invention

The present invention relates to a method for forming vias in a semiconductor substrate and a semiconductor device, and more particularly to a method for forming an insulating layer on the side wall of vias in a semiconductor substrate by using polymer, and a method for forming a semiconductor device having the semiconductor substrate.

2. Description of the Related Art

FIGS. 1 to 3 show schematic views of a conventional method for forming vias in a semiconductor substrate. First, referring to FIG. 1, a semiconductor substrate 1 is provided. The semiconductor substrate 1 has a first surface 11 and a second surface 12. Afterward, a plurality of grooves 13 is formed on the first surface 11 of the semiconductor substrate 1. An insulating layer 14 is then formed on the side wall of the grooves 13 by chemical vapor deposition, and a plurality of accommodating spaces 15 is formed. The material of the insulating layer 14 is usually silicon dioxide.

Afterward, referring to FIG. 2, the accommodating spaces 15 are filled with a conductive metal 16. The material of the conductive metal 16 is usually copper. Finally, the first surface 11 and the second surface 12 of the semiconductor substrate 1 are ground or etched so as to expose the conductive metal 16, as shown in FIG. 3.

In the conventional method, the insulating layer 14 is formed by chemical vapor deposition, so that the thickness of the insulating layer 14 on the side wall of the grooves 13 is limited, and is usually under 0.5 □m. Moreover, the thickness of the insulating layer 14 on the side wall of the grooves 13 is not even, that is, the thickness of the insulating layer 14 on the upper side wall of the grooves 13 is not exactly equal to that on the lower side wall of the grooves 13. Thus, the electrical capacity is not uniform.

Therefore, it is necessary to provide a method for forming vias in a semiconductor substrate to solve the above problems.

SUMMARY OF THE INVENTION

The present invention is directed to a method for forming vias in a semiconductor substrate, which comprises the following steps: (a) providing a semiconductor substrate having a first surface and a second surface; (b) forming a groove on the semiconductor substrate, wherein the groove does not entirely penetrate through the semiconductor substrate; (c) filling the groove with a conductive metal; (d) removing part of the semiconductor substrate which surrounds the conductive metal, wherein the conductive metal is maintained so as to form an accommodating space between the conductive metal and the semiconductor substrate; and (e) forming an insulating material in the accommodating space.

In the present invention, thicker polymer can be formed in the accommodating space. Also, the thickness of the insulating material in the accommodating space is even. Moreover, the polymer is used as an insulating material in the present invention, so that the polymers with different materials can be chosen for specific processes.

The present invention is also directed to a method for forming a semiconductor device, which comprises the following steps: (a) providing a semiconductor substrate having a first surface and a second surface; (b) forming a groove on the semiconductor substrate, wherein the groove does not entirely penetrate through the semiconductor substrate; (c) filling the groove with a conductive metal; (d) removing part of the semiconductor substrate which surrounds the conductive metal, wherein the conductive metal is maintained so as to form an accommodating space between the conductive metal and the semiconductor substrate; (e) forming an insulating material in the accommodating space; (f) forming a portion of an active device in the semiconductor substrate; and (g) forming one or more wiring layers over the first surface of the semiconductor substrate, wherein a wire of the one or more wiring layers closest to the semiconductor substrate contacts a top surface of the conductive metal.

The present invention is also directed to a method for forming a semiconductor device, which comprises the following steps: (a) providing a semiconductor substrate having a first surface and a second surface; (b) forming a portion of an active device in the semiconductor substrate at a location adjacent to the first surface of the semiconductor substrate; (c) forming one or more wiring layers over the first surface of the semiconductor substrate after step (b); (d) forming a groove in the semiconductor substrate after step (c); (e) filling the groove with a conductive metal; (f) removing part of the wiring layers and the semiconductor substrate which surround the conductive metal while leaving the conductive metal substantially intact thereby forming an accommodating space surrounding the conductive metal; and (g) forming an insulating material in the accommodating space.

DETAILED DESCRIPTION OF THE INVENTION

Figure 1:
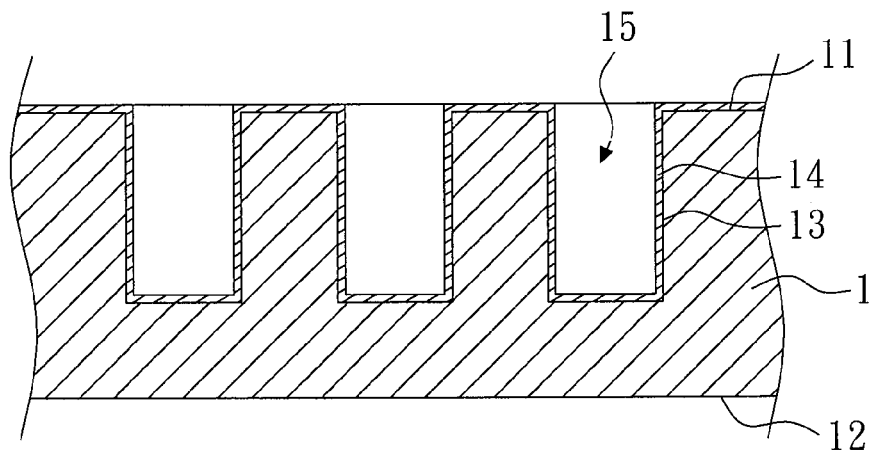
FIGS. 1 to 3 are schematic views of a conventional method for forming vias in a semiconductor substrate.
Figure 2:
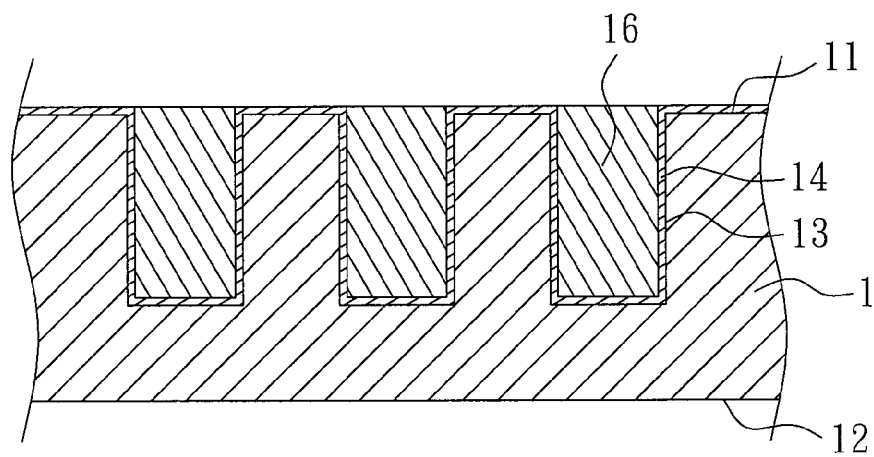
Figure 3:
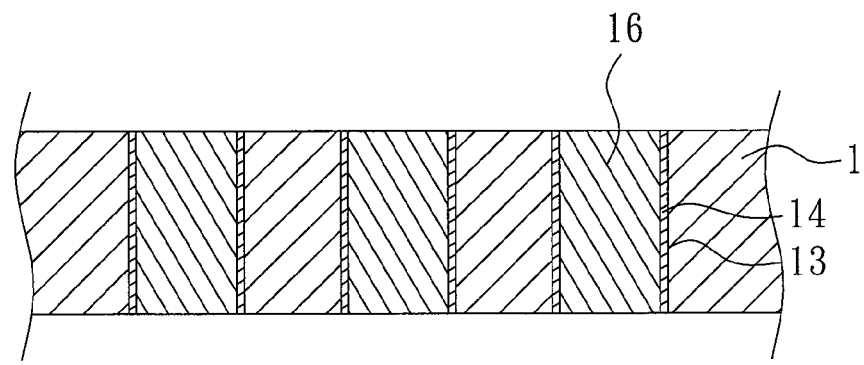
Figure 4:
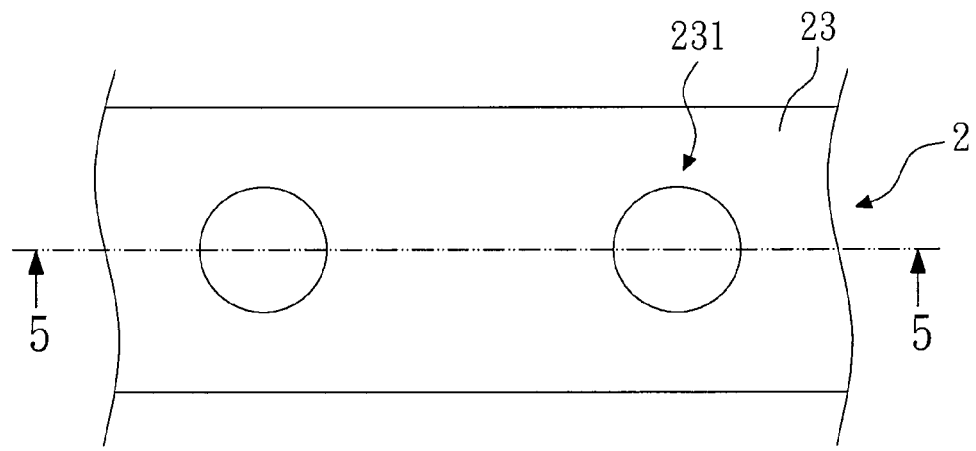
FIGS. 4 to 19 are schematic views of a method for forming vias in a semiconductor substrate according to a first embodiment of the present invention.
Figure 5:
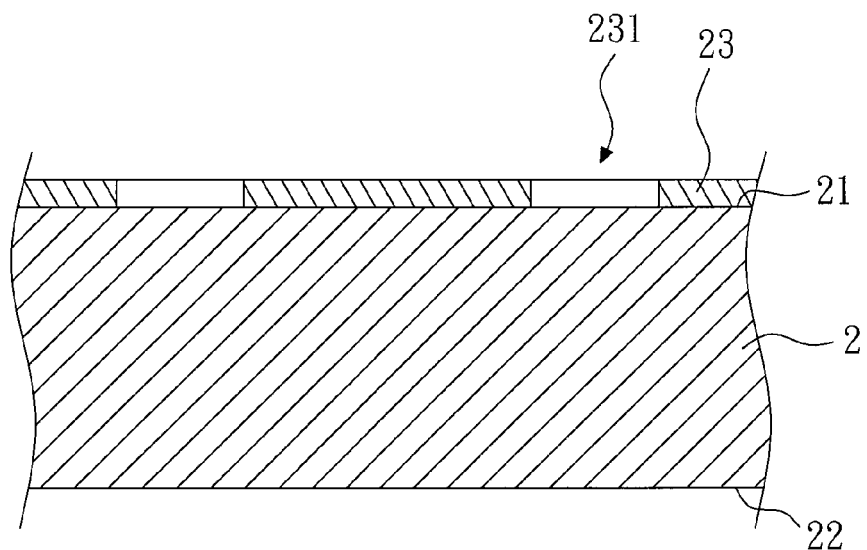

FIGS. 4 to 19 show the schematic views of the method for forming vias in a semiconductor substrate according to the first embodiment of the present invention. Referring to FIG. 4, a top view of the semiconductor substrate 2, and FIG. 5, a cross-sectional view of the semiconductor substrate 2 along line 5-5 in FIG. 4, first, a semiconductor substrate 2 is provided. The semiconductor substrate 2 has a first surface 21 and a second surface 22. The semiconductor substrate 2 is, for example, a wafer or made from silicon. Afterward, a first photo resist layer 23 is formed on the first surface 21 of the semiconductor substrate 2, and a first opening 231 is formed on the first photo resist layer 23. In the embodiment, the first opening 231 is circular from the top view. It is understood that the first opening 231 may be square from the top view.

Figure 6:
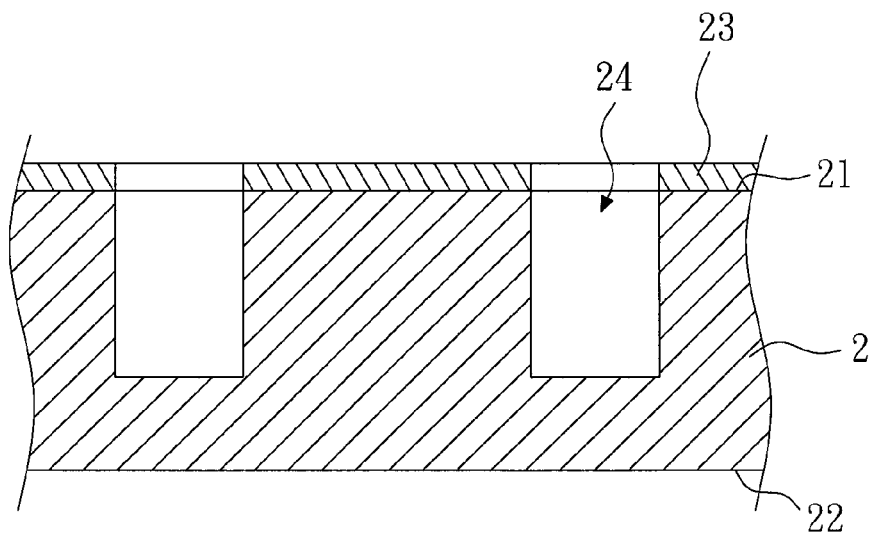
Figure 7:
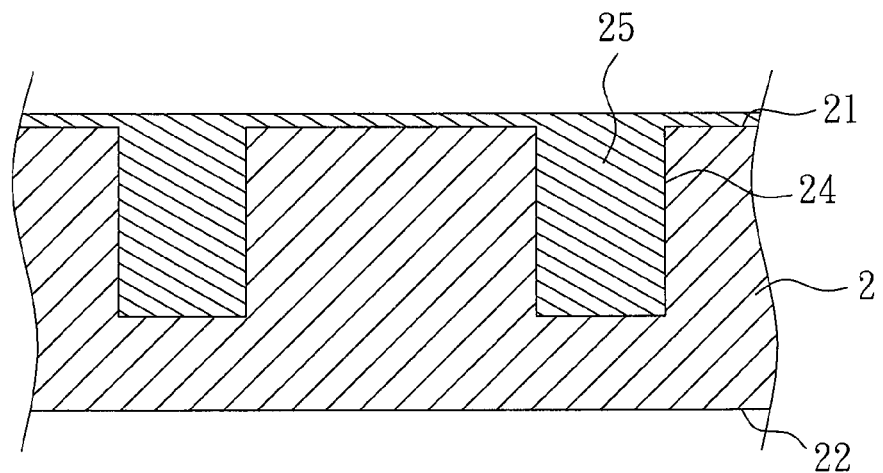
Figure 8:
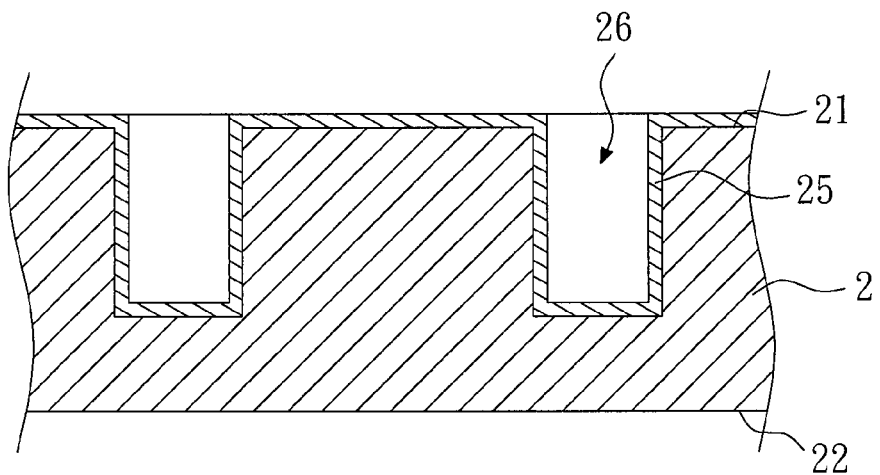

Referring to FIG. 6, a groove 24 is formed on the semiconductor substrate 2 according to the first opening 231 by etching or other methods, and the groove 24 does not entirely penetrate through the semiconductor substrate 2. Afterward, the first photo resist layer 23 is removed. Then, referring to FIG. 7, the groove 24 is filled with a conductive metal 25. In the embodiment, the material of the conductive metal 25 is copper, and the conductive metal 25 fills up the groove 24 by electroplating. It is understood that the conductive metal 25 may not fill up the groove 24, and forms a central groove 26, that is, the conductive metal 25 is formed on the side wall of the groove 24 only, as shown in FIG. 8.

Figure 9:
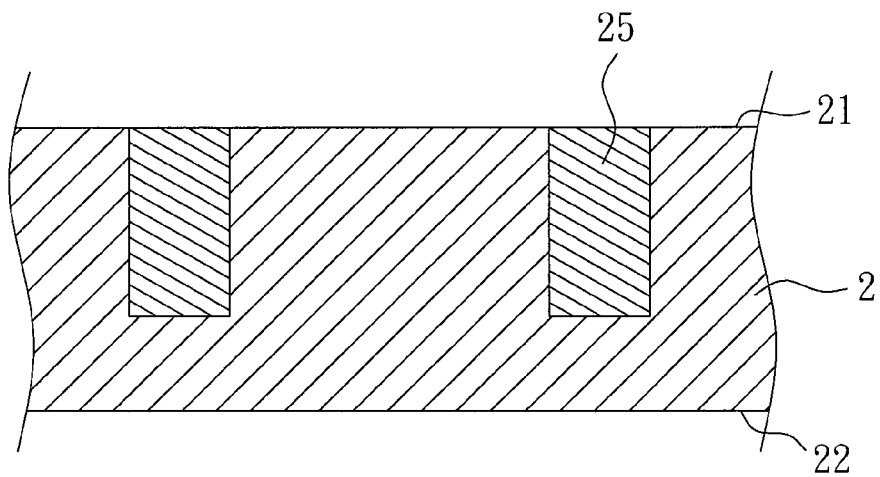
Figure 10:
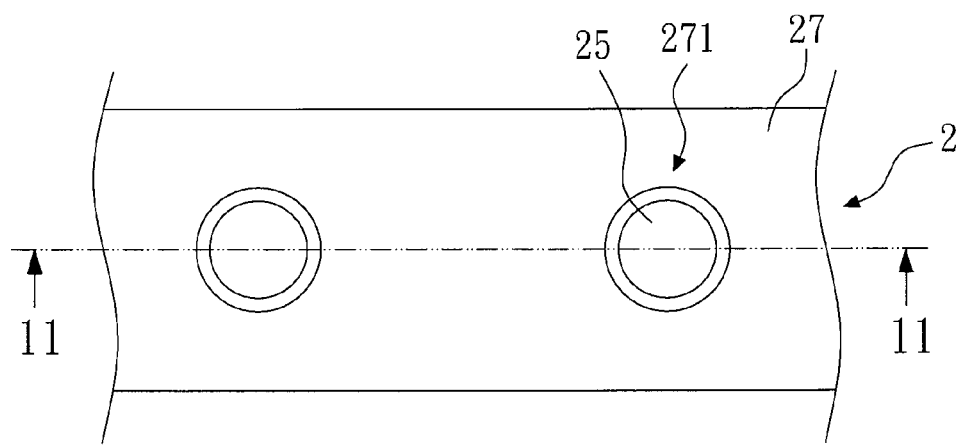
Figure 11:
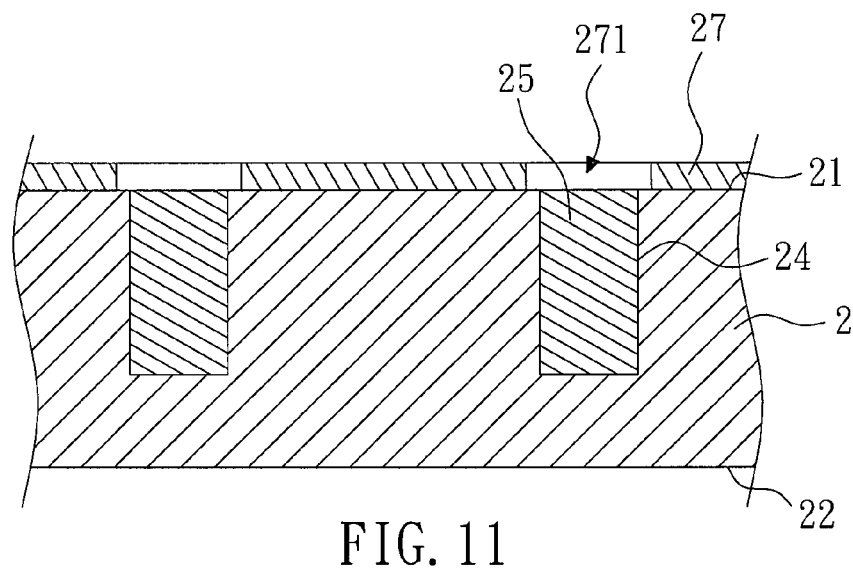
Figure 12:
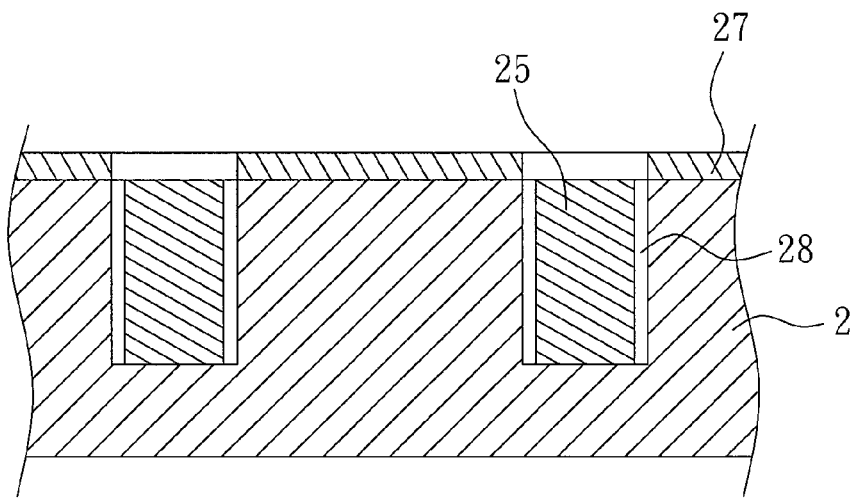

Referring to FIG. 9, the conductive metal 25 which is outside the groove 24 is removed by etching or grinding so as to expose the first surface 21 of the semiconductor substrate 2. Then, referring to FIGS. 10 to 12, part of the semiconductor substrate 2 which surrounds the conductive metal 25 is removed, and the conductive metal 25 is maintained so as to form an accommodating space 28 between the conductive metal 25 and the semiconductor substrate 2. In the embodiment, the accommodating space 28 is formed by the following methods. Referring to FIG. 10, a top view of the semiconductor substrate 2, and FIG. 11, a cross-sectional view of the semiconductor substrate 2 along line 11-11 in FIG. 10, first, a second photo resist layer 27 is formed on the first surface 21 of the semiconductor substrate 2. A second opening 271 is then formed on the second photo resist layer 27, and is at a position corresponding to the groove 24. The second opening 271 is larger than the first opening 231 (FIGS. 4 and 5) so as to expose the conductive metal 25. In the embodiment, the second opening 271 is circular and has a central axis, the groove 24 is circular and has a central axis, and the central axes of the second opening 271 and the groove 24 are the same, that is, the central axis of the second opening 271 is the central axis of the groove 24. It is understood that the central axes of the second opening 271 and the groove 24 may not be the same, but the conductive metal 25 must be exposed. Then, referring to FIG. 12, part of the semiconductor substrate 2 which surrounds the conductive metal 25 is removed by etching or other methods, and the conductive metal 25 is maintained so as to form an accommodating space 28 between the conductive metal 25 and the semiconductor substrate 2. The accommodating space 28 surrounds the conductive metal 25. The second photo resist layer 27 is then removed.

Referring to FIGS. 13 to 18, an insulating material is formed in the accommodating space 28. In the embodiment, the insulating material is polymer 29. However, the insulating material may be silicon dioxide or other material with a property of insulation. In the present invention, the method for forming the polymer 29 in the accommodating space 28 includes but is not limited to the following three methods.

Figure 13:
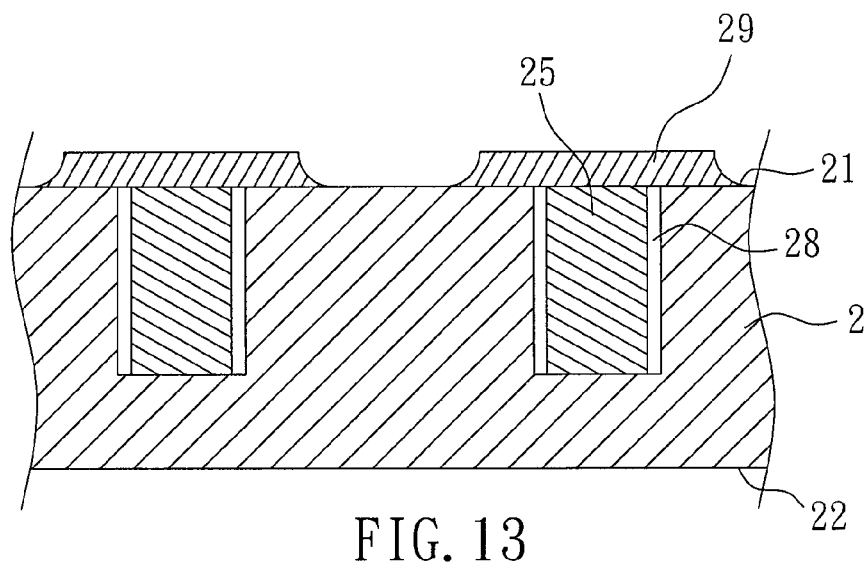
Figure 14:
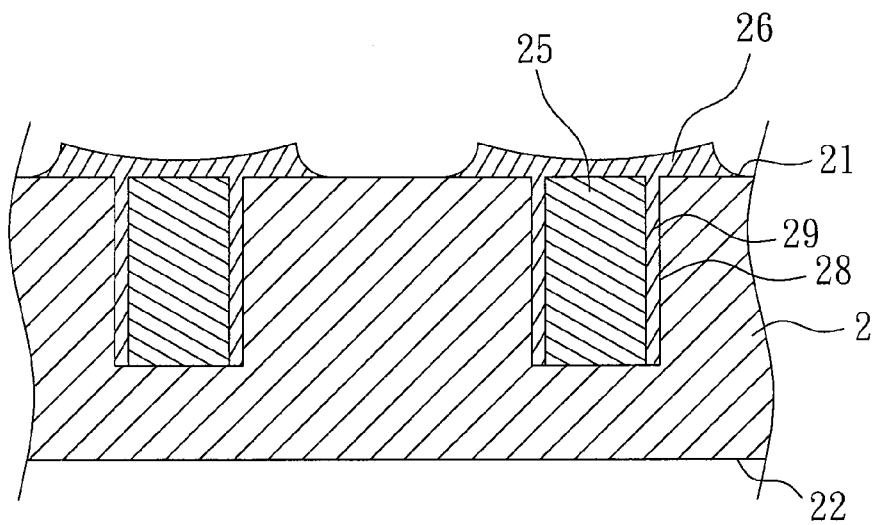
Figure 18:
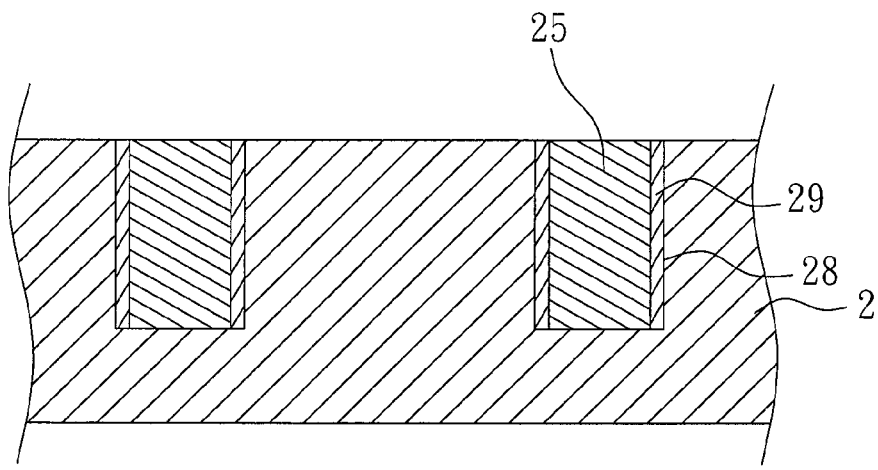

The first method is that the polymer 29 is dispersed on the first surface 21 of the semiconductor substrate 2, and the position of the polymer 29 corresponds to the accommodating space 28, as shown in FIG. 13. Afterward, the polymer 29 is sucked into the accommodating space 28 by vacuuming, as shown in FIG. 14. Finally, part of the polymer 29 which is outside the accommodating space 28 is removed, as shown in FIG. 18.

Figure 15:
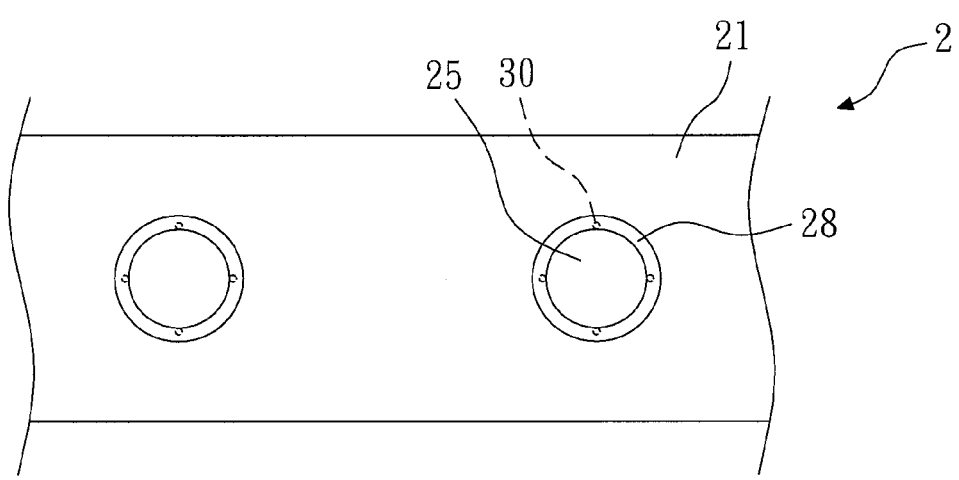
Figure 16:
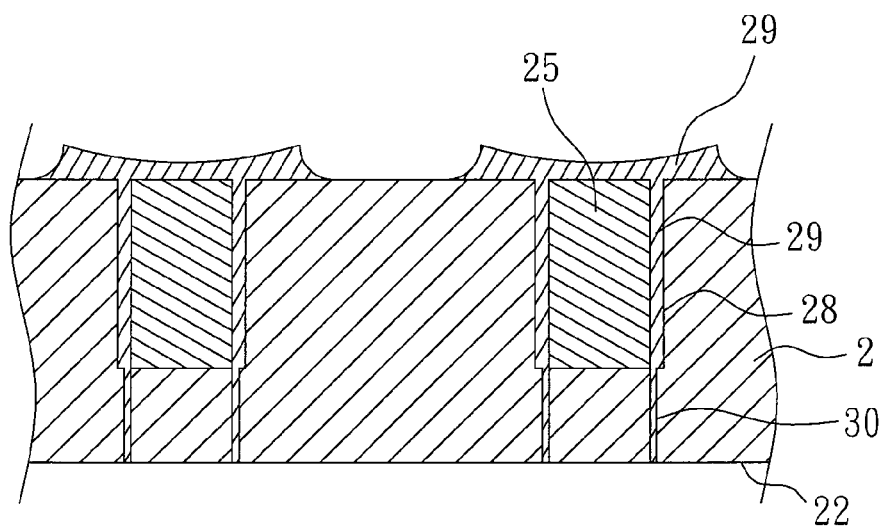

The second method is that a plurality of vents 30 is formed to connect the accommodating space 28 to the second surface 22 of the semiconductor substrate 2, as shown in the top view of FIG. 15. Afterward, the polymer 29 is dispersed on the first surface 21 of the semiconductor substrate 2, and the position of the polymer 29 corresponds to the accommodating space 28. The accommodating space 28 and the vents 30 are then filled with the polymer 29, as shown in FIG. 16. Finally, part of the polymer 29 which is outside the accommodating space 28 and the vents 30 is removed.

Figure 17:
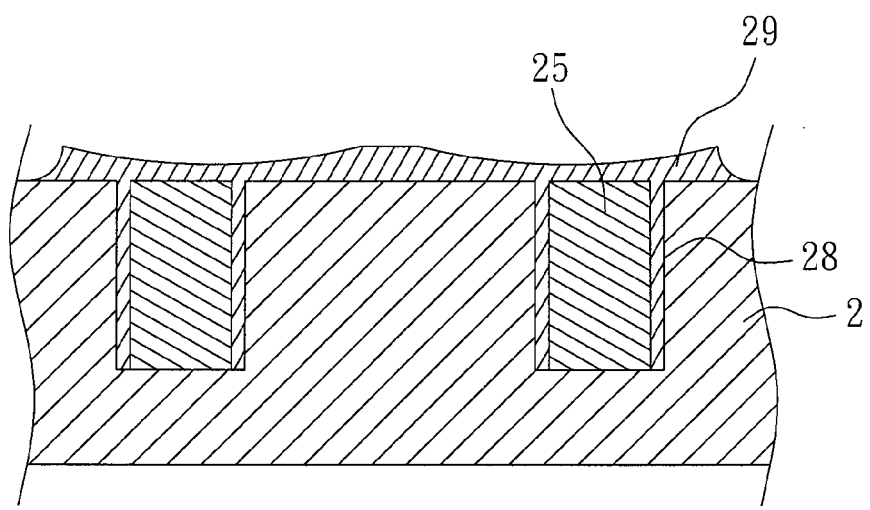

The third method is that the polymer 29 is atomized and deposited in the accommodating space 28 by spray coating, as shown in FIG. 17. Finally, part of the polymer 29 which is outside the accommodating space 28 is removed, as shown in FIG. 18.

It should be noted that in the previous steps, if the conductive metal 25 does not fill up the groove 24, it forms a central groove 26 instead, as shown in FIG. 8. In the above-mentioned three methods, the polymer 29 fills up both the accommodating space 28 and the central groove 26.

Figure 19:
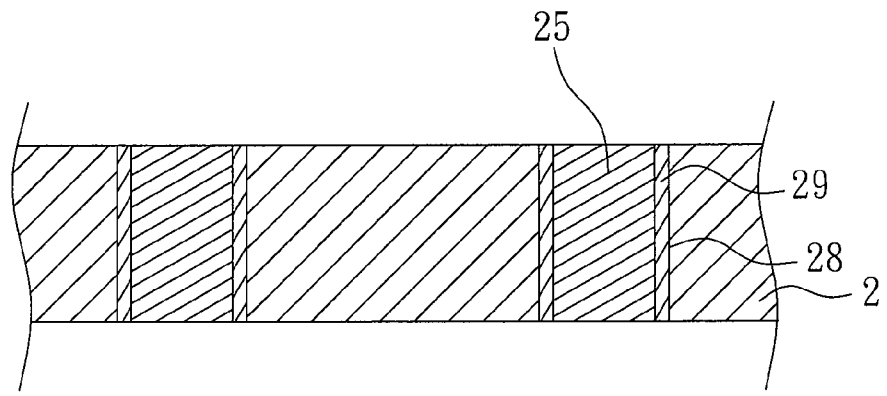

Finally, preferably, referring to FIG. 19, part of the second surface 22 of the semiconductor substrate 2 is removed by etching or grinding so as to expose the conductive metal 25 and the insulating material (the polymer 29). Part of the first surface 21 of the semiconductor substrate 2 may preferably be removed by etching or grinding at the same time.

Figure 20:
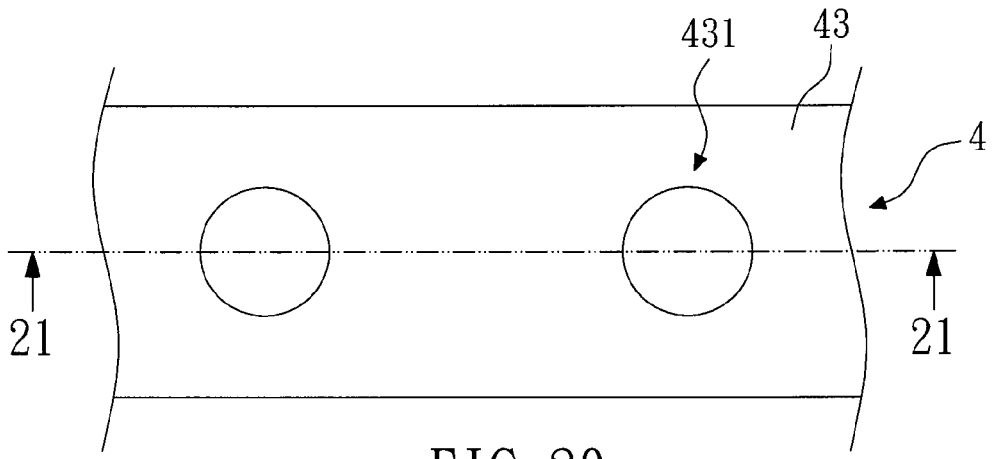
FIGS. 20 to 27 are schematic views of a method for forming vias in a semiconductor substrate according to a second embodiment of the present invention.

FIGS. 20 to 27 show the schematic views of the method for forming vias in a semiconductor substrate according to the second embodiment of the present invention. Referring to FIG. 20, a top view of the semiconductor substrate 4, and FIG. 21, a cross-sectional view of the semiconductor substrate 4 along line 21-21 in FIG. 20, first, a semiconductor substrate 4 is provided. The semiconductor substrate 4 has a first surface 41 and a second surface 42. The semiconductor substrate 4 is, for example, a wafer or made from silicon. Afterward, a first photo resist layer 43 is formed on the first surface 41 of the semiconductor substrate 4, and a first opening 431 is formed on the first photo resist layer 43.

Figure 22:
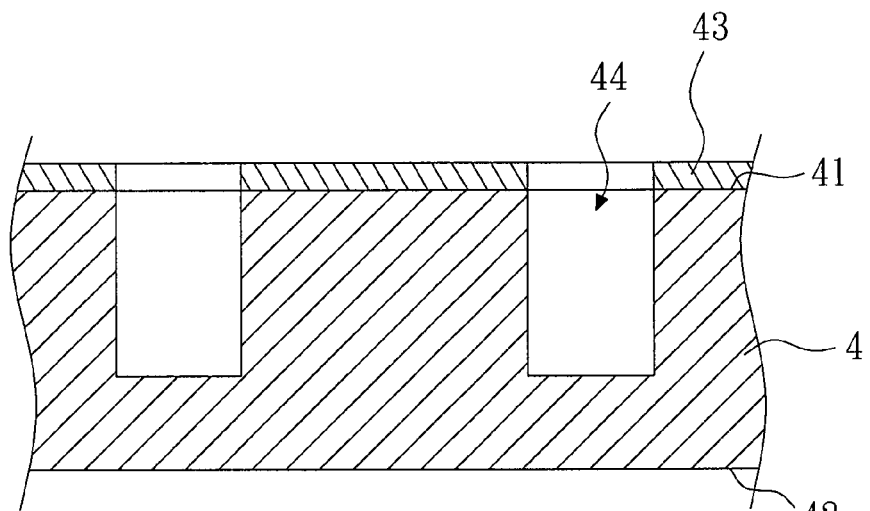
Figure 23:
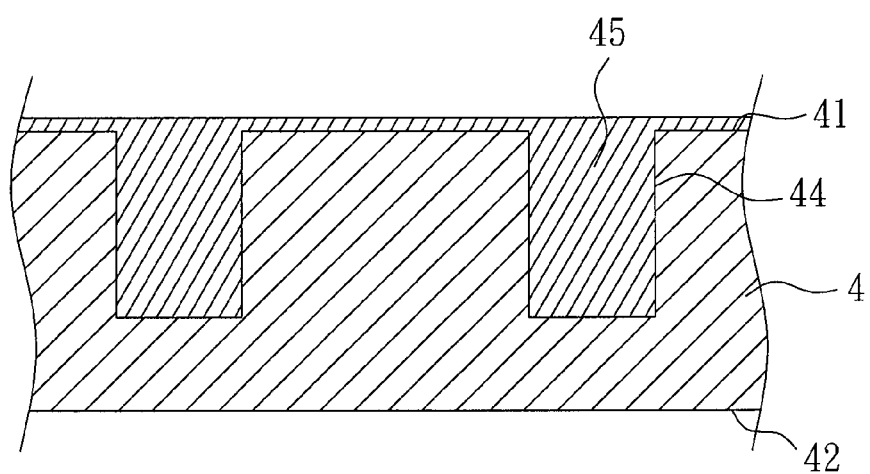

Referring to FIG. 22, a groove 44 is formed on the semiconductor substrate 4 according to the first opening 431 by etching or other methods, and the groove 44 does not entirely penetrate through the semiconductor substrate 4. Afterward, the first photo resist layer 43 is removed. Then, referring to FIG. 23, the groove 44 is filled with a conductive metal 45. In the embodiment, the material of the conductive metal 45 is copper, and the conductive metal 45 fills up the groove 44 by electroplating. It is understood that the conductive metal 45 may not fill up the groove 44.

Figure 21:
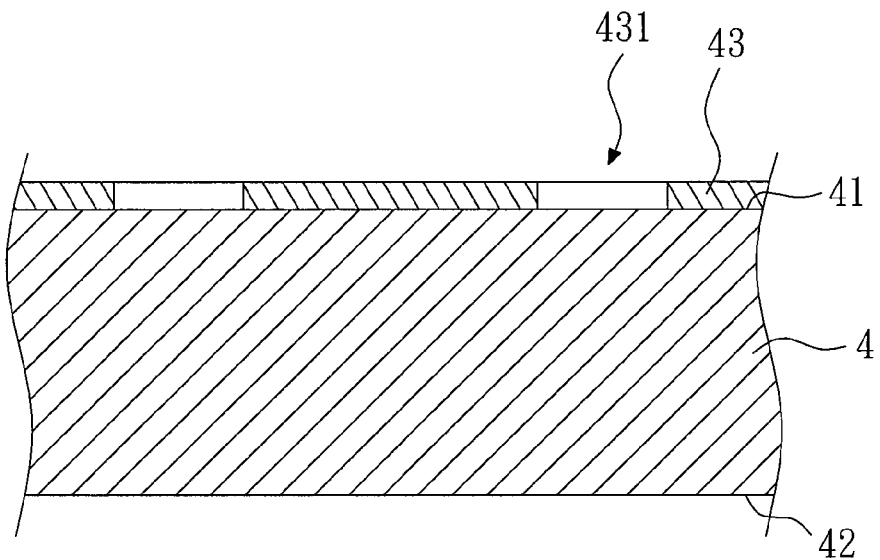
Figure 24:
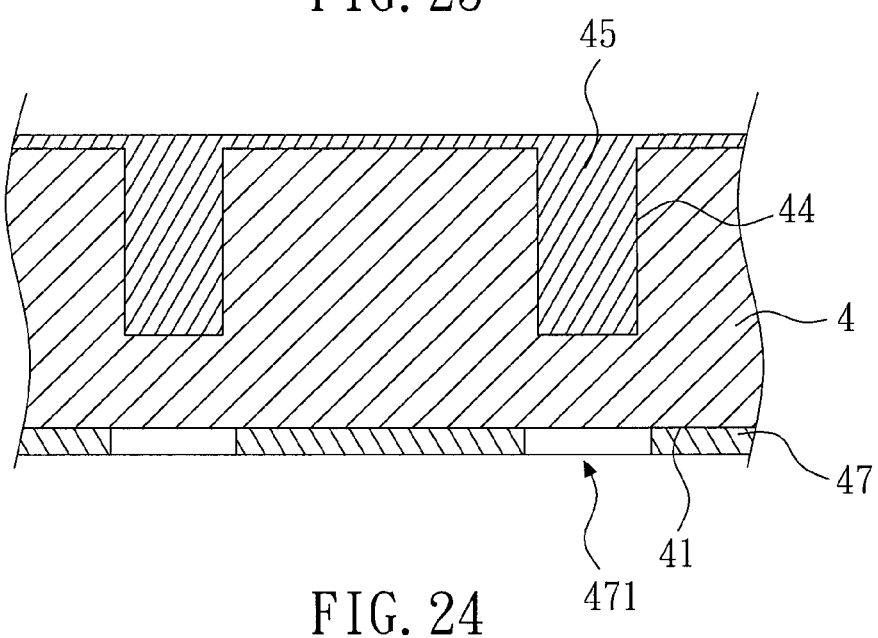
Figure 25:
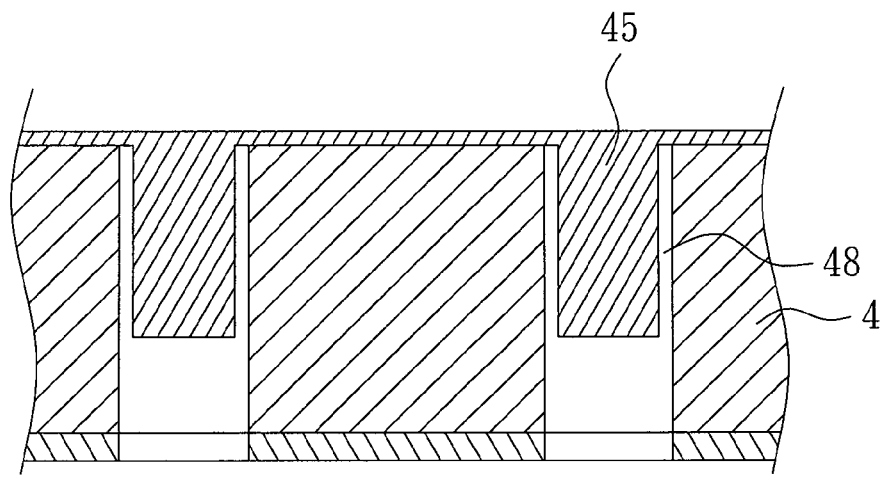

Referring to FIGS. 24 to 25, part of the semiconductor substrate 4 which surrounds the conductive metal 45 is removed, and the conductive metal 45 is maintained to form an accommodating space 48 between the conductive metal 45 and the semiconductor substrate 4. In the embodiment, the accommodating space 48 is formed by the following methods. First, referring to FIG. 24, a second photo resist layer 47 is formed on the second surface 42 of the semiconductor substrate 4. A second opening 471 is then formed on the second photo resist layer 47, and is at a position corresponding to the groove 44. The second opening 471 is larger than the first opening 431 (FIG. 21). In the embodiment, the second opening 471 is circular and has a central axis, the groove 44 is circular and has a central axis, and the central axes of the second opening 471 and the groove 44 are the same, that is, the central axis of the second opening 471 is the central axis of the groove 44. It is understood that the central axes of the second opening 471 and the groove 44 may not be the same. Then, referring to FIG. 25, part of the semiconductor substrate 4 which surrounds the conductive metal 45 is removed by etching or other methods, and the conductive metal 45 is maintained so as to form an accommodating space 48 between the conductive metal 45 and the semiconductor substrate 4. The accommodating space 48 surrounds the conductive metal 45. The second photo resist layer 47 is then removed.

Figure 26:
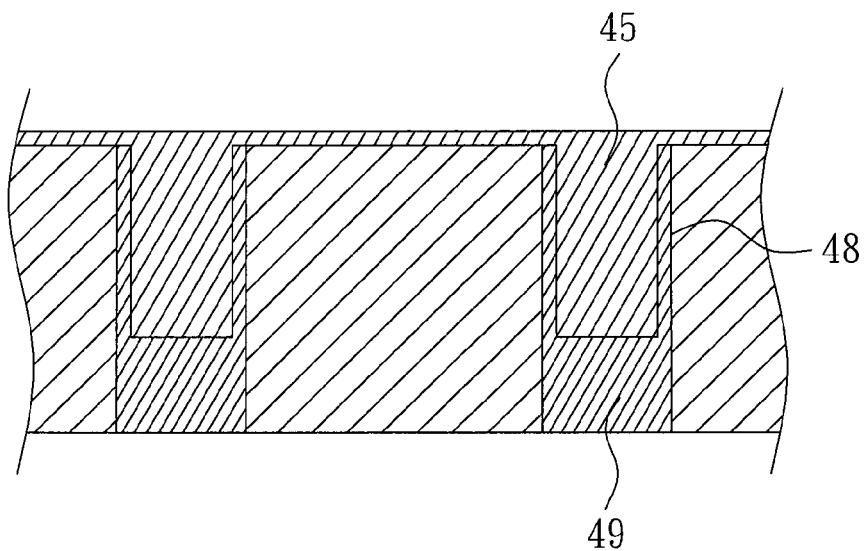

Referring to FIG. 26, an insulating material is formed in the accommodating space 48. In the embodiment, the material of the insulating material is polymer 49. However, the material of the insulating material may be silicon dioxide or other material with a property of insulation. In the present invention, the method for forming the polymer 49 in the accommodating space 48 includes but is not limited to the three methods described above in the first embodiment.

Figure 27:
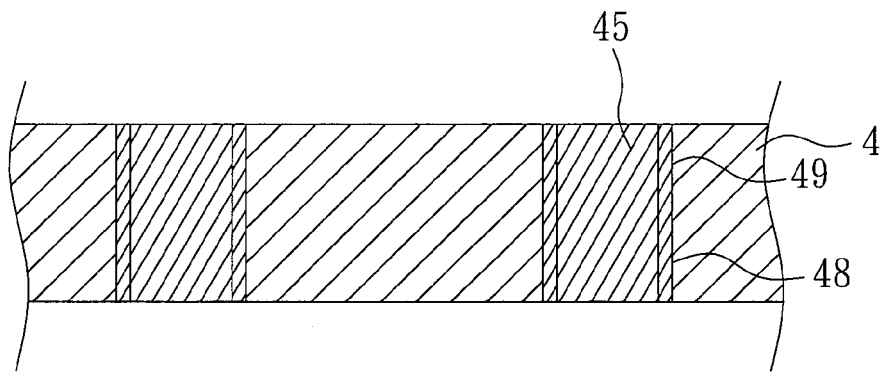

Finally, referring to FIG. 27, part of the second surface 42 of the semiconductor substrate 4 is removed by etching or grinding to expose the conductive metal 45 and the insulating material (the polymer 49). Part of the first surface 41 of the semiconductor substrate 4 may preferably be removed by etching or grinding at the same time.

In the present invention, thicker insulating material (polymer 29, 49 for example) can be formed in the accommodating space 28, 48. Also, the thickness of the insulating material (polymer 29, 49 for example) in the accommodating space 28, 48 is even. Moreover, the polymer 29, 49 is used as an insulating material in the present invention, so that the polymers with different materials can be chosen for specific processes.

Figure 28:
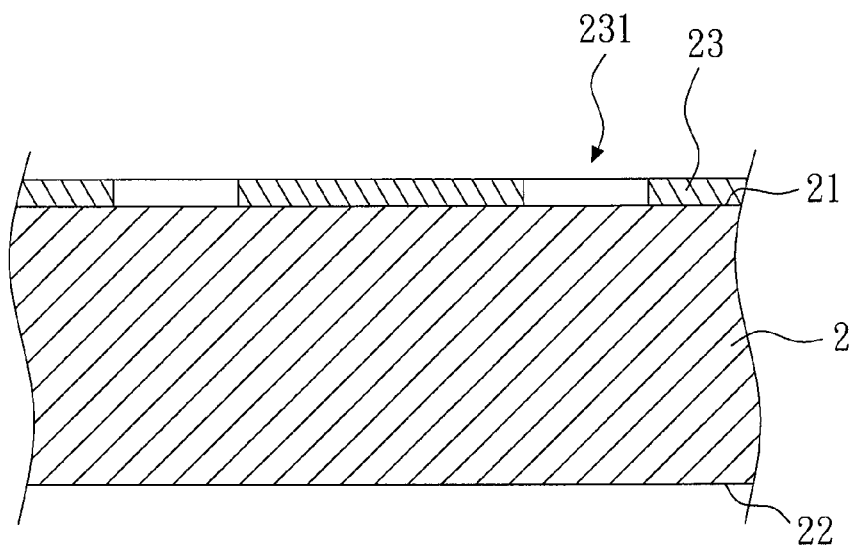
FIGS. 28 to 38 are schematic views of the method for forming a semiconductor device according to the third embodiment of the present invention.
Figure 29:
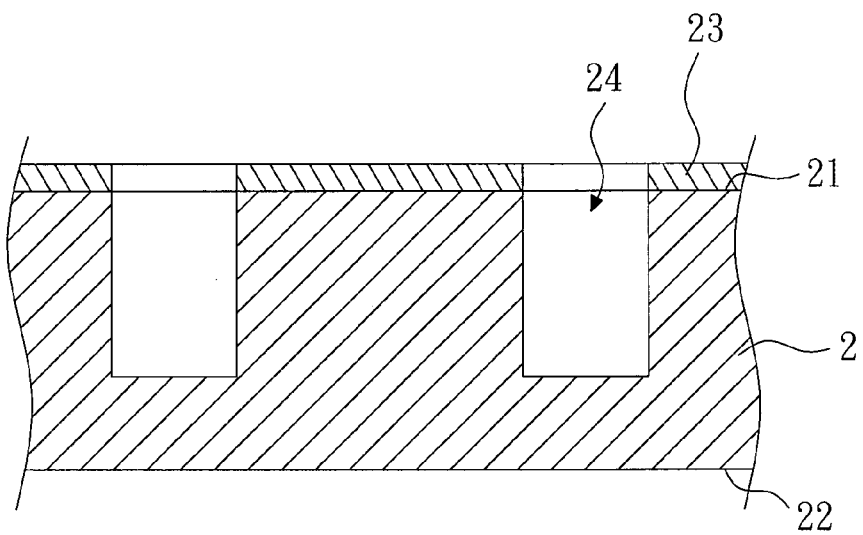
Figure 30:
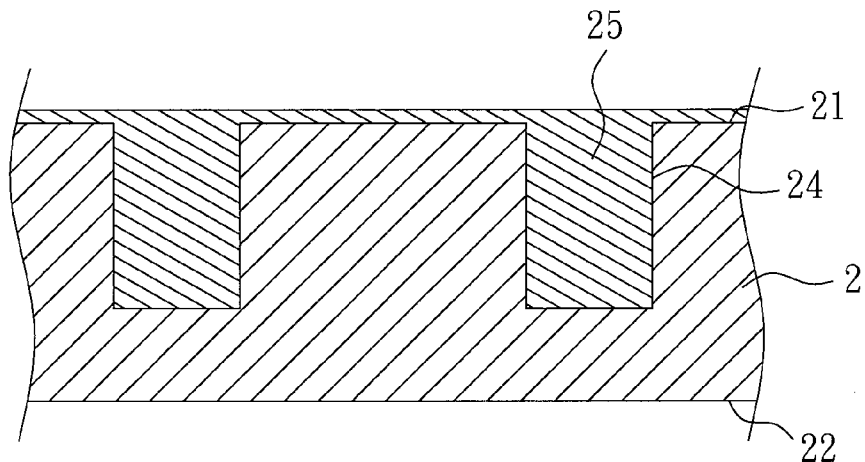

FIGS. 28 to 38 show the schematic views of the method for forming a semiconductor device according to the third embodiment of the present invention. Referring to FIG. 28, a semiconductor substrate 2 is provided. The semiconductor substrate 2 has a first surface 21 and a second surface 22. The semiconductor substrate 2 is, for example, a wafer or made of semiconductor material. Although silicon is the preferred semiconductor material, the invention applies to any semiconductor material, such as germanium, silicon germanium, gallium arsenide, or other III-V and II-IV compounds used in subsequent device fabrication. Afterward, a first photo resist layer 23 is formed on the first surface 21 of the semiconductor substrate 2, and a first opening 231 is formed on the first photo resist layer 23. In the embodiment, the first opening 231 is circular from the top view. It is understood that the first opening 231 may be square, rectangular, hexagonal or other shape from the top view.

Figure 31:
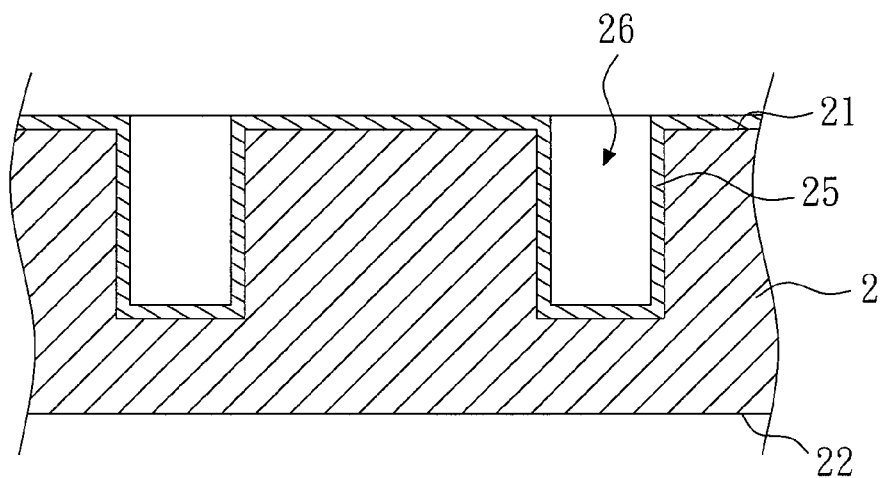

Referring to FIG, 29, a groove 24 is formed on the semiconductor substrate 2 according to the first opening 231 by etching or other methods, and the groove 24 does not entirely penetrate through the semiconductor substrate 2. Afterward, the first photo resist layer 23 is removed. Then, referring to FIG. 30, the groove 24 is filled with a conductive metal 25. In the embodiment, the material of the conductive metal 25 is copper, and the conductive metal 25 fills up the groove 24 by electroplating. It is understood that the conductive metal 25 may not fill up the groove 24, and forms a central groove 26, that is, the conductive metal 25 is formed on the side wall of the groove 24 only, as shown in FIG. 31.

Figure 32:
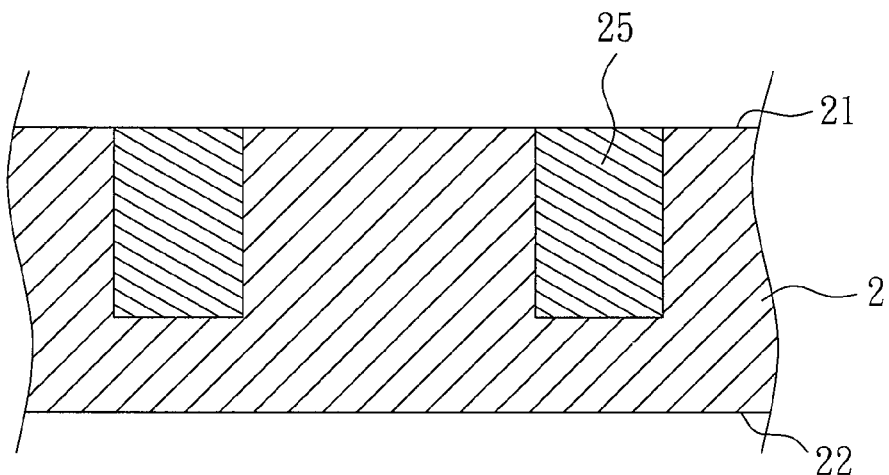
Figure 33:
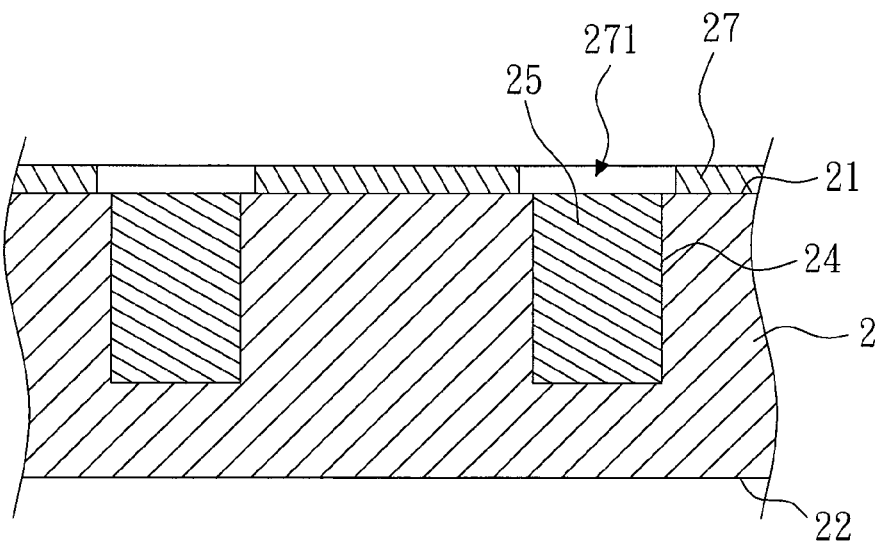
Figure 34:
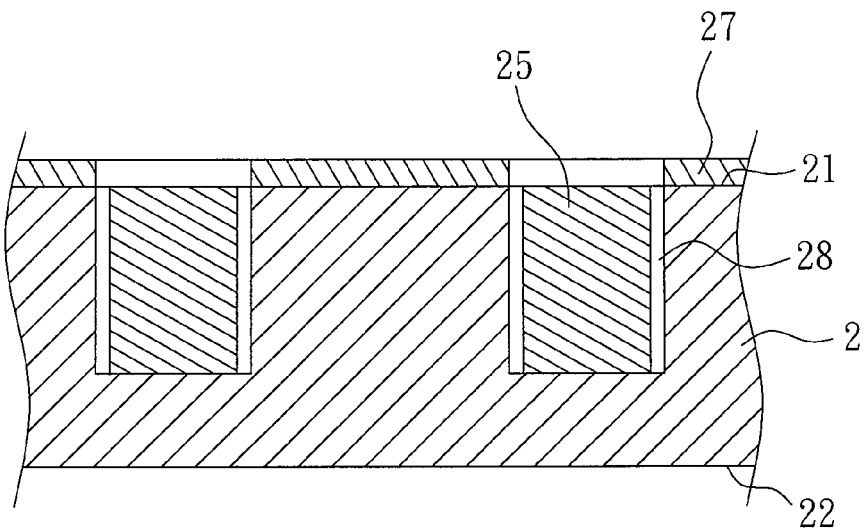

Referring to FIG. 32, the conductive metal 25 which is outside the groove 24 is removed by etching or grinding so as to expose the first surface 21 of the semiconductor substrate 2. Then, referring to FIGS. 33 to 34, part of the semiconductor substrate 2 which surrounds the conductive metal 25 is removed, and the conductive metal 25 is maintained so as to form an accommodating space 28 between the conductive metal 25 and the semiconductor substrate 2. In the embodiment, the accommodating space 28 is formed by the following methods. Referring to FIG. 33, first, a second photo resist layer 27 is formed on the first surface 21 of the semiconductor substrate 2. A second opening 271 is then formed on the second photo resist layer 27, and is at a position corresponding to the groove 24. The second opening 271 is larger than the first opening 231 (FIG. 28) so as to expose the conductive metal 25. In the embodiment, the second opening 271 is circular and has a central axis, the groove 24 is circular and has a central axis, and the central axes of the second opening 271 and the groove 24 are the same, that is, the central axis of the second opening 271 is the central axis of the groove 24. It is understood that the central axes of the second opening 271 and the groove 24 may not be the same, but the conductive metal 25 must be exposed. Then, referring to FIG. 34, part of the semiconductor substrate 2 which surrounds the conductive metal 25 is removed by etching or other methods, and the conductive metal 25 is maintained so as to form an accommodating space 28 between the conductive metal 25 and the semiconductor substrate 2. The accommodating space 28 surrounds the conductive metal 25. The second photo resist layer 27 is then removed.

Figure 35:
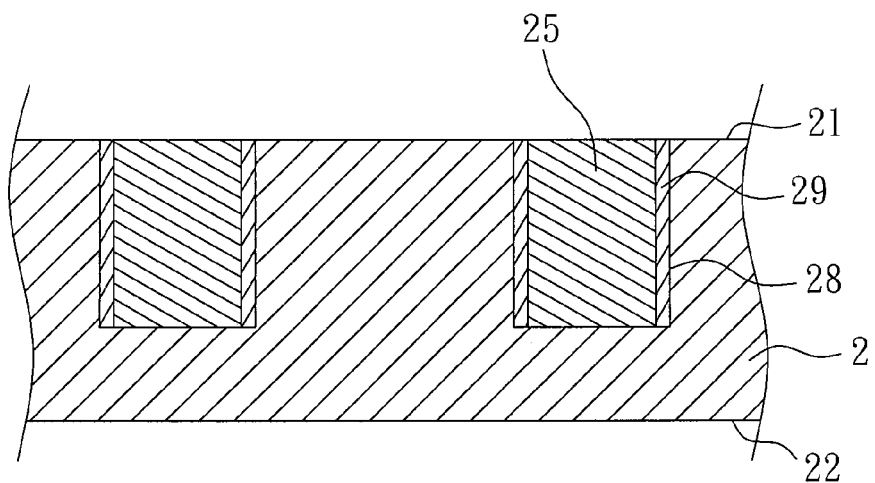

Referring to FIG. 35, an insulating material is formed in the accommodating space 28. In the embodiment, the insulating material is polymer 29. However, the insulating material may be silicon dioxide or other material with a property of insulation. In the present invention, the method for forming the polymer 29 in the accommodating space 28 includes but is not limited to the above-mentioned three methods.

Figure 36:
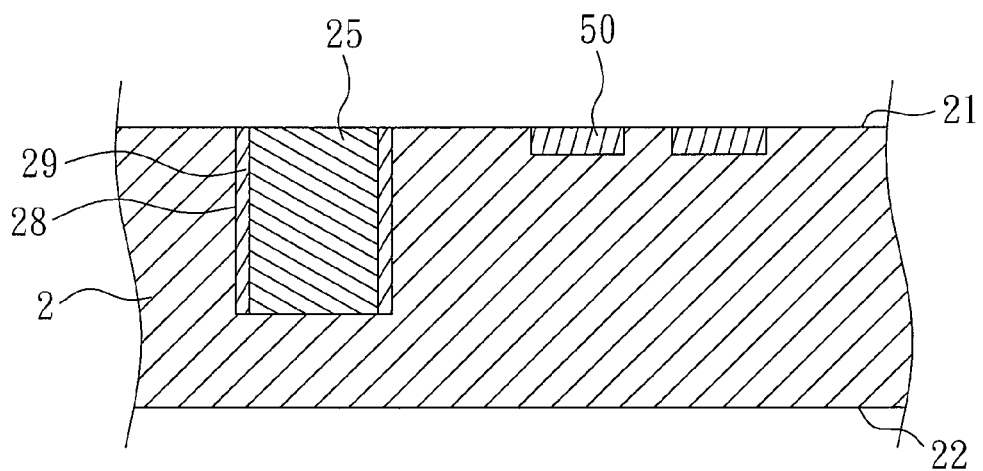

Referring to FIG. 36, a portion of an active device 50 is formed in the semiconductor substrate 2.

Figure 37:
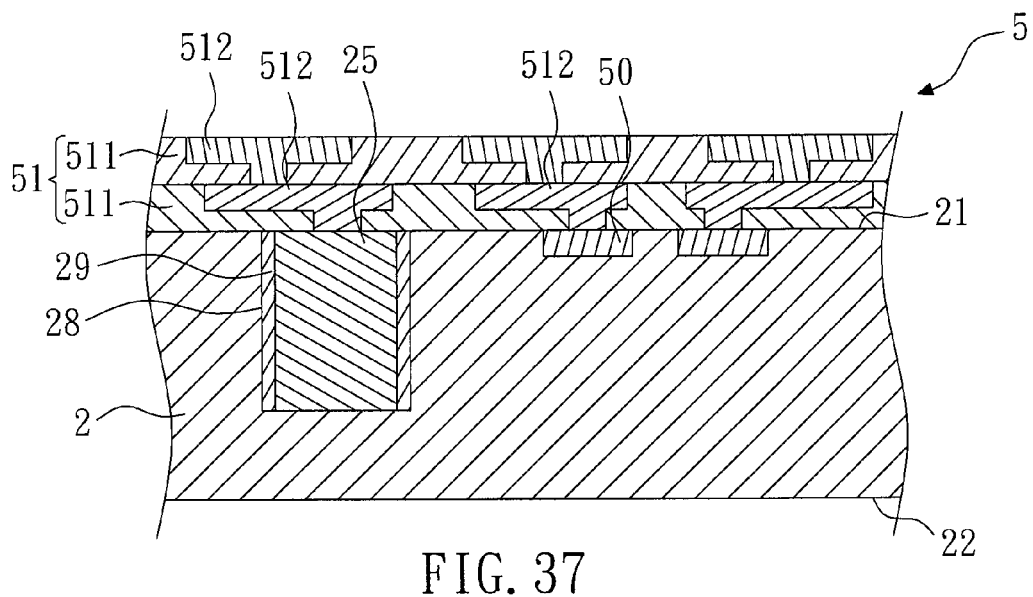

Referring to FIG. 37, one or more wiring layers 51 are formed over the first surface 21 of the semiconductor substrate 2, so as to form a semiconductor device 5. The wiring layers 51 comprise at least one dielectric layer 511 and at least one wire 512. The wire 512 is disposed in the dielectric layer 511 and is electrically connected to the conductive metal 25 and the active device 50. In the embodiment, the wire 512 of the wiring layers 51 closest to the semiconductor substrate 2 contacts a top surface of the conductive metal 25 and the active device 50.

Figure 38:
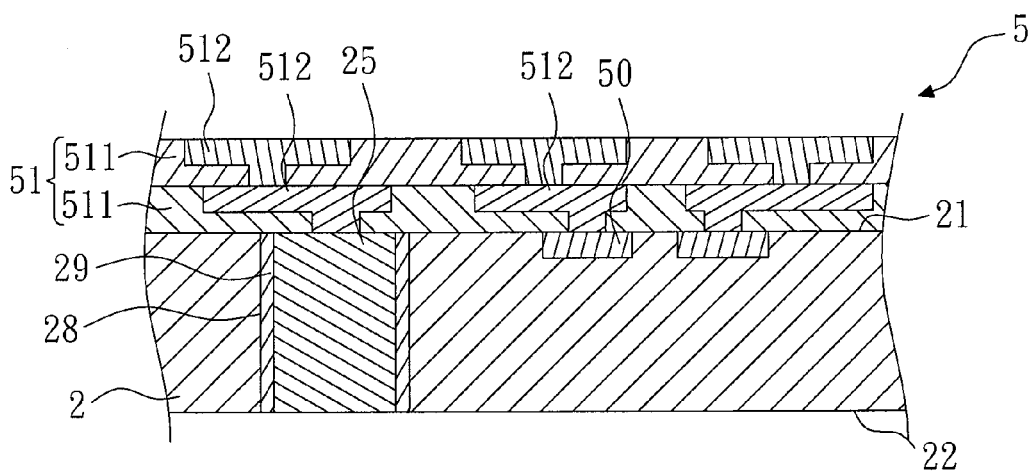

Preferably, referring to FIG. 38, part of the second surface 22 of the semiconductor substrate 2 is removed by etching or grinding so as to expose the conductive metal 25 and the insulating material (the polymer 29).

Figure 39:
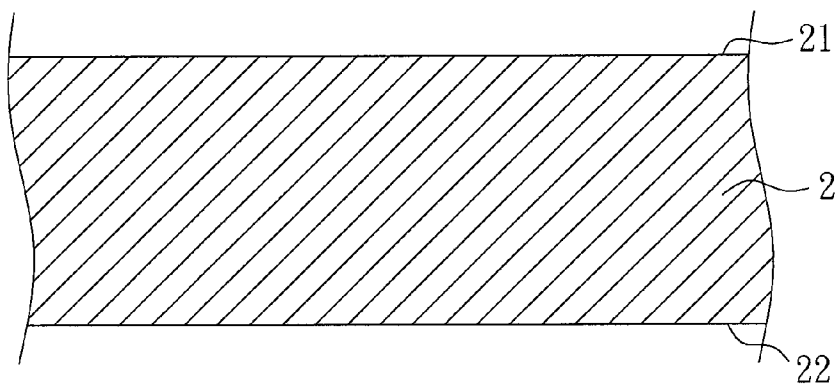
FIGS. 39 to 50 are schematic views of the method for forming a semiconductor device according to the fourth embodiment of the present invention.

FIGS. 39 to 50 show the schematic views of the method for forming a semiconductor device according to the fourth embodiment of the present invention. Referring to FIG. 39, a semiconductor substrate 2 is provided. The semiconductor substrate 2 has a first surface 21 and a second surface 22. The semiconductor substrate 2 is, for example, a wafer or made of semiconductor material. Although silicon is the preferred semiconductor material, the invention applies to any semiconductor material, such as germanium, silicon germanium, gallium arsenide, or other III-V and II-IV compounds used in subsequent device fabrication.

Figure 40:
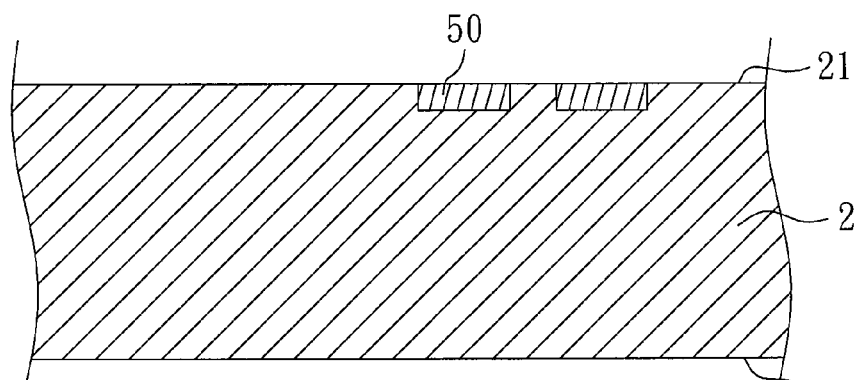

Referring to FIG. 40, a portion of an active device 50 is formed in the semiconductor substrate 2 at a location adjacent to the first surface 21 of the semiconductor substrate 2.

Figure 41:
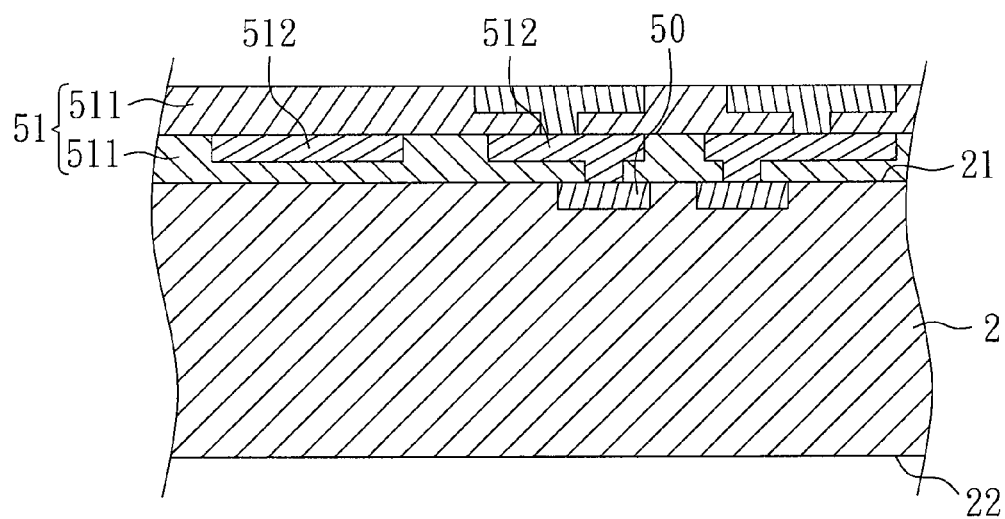

Referring to FIG. 41, one or more wiring layers 51 are formed over the first surface 21 of the semiconductor substrate 2. The wiring layers 51 comprise at least one dielectric layer 511 and at least one wire 512. The wire 512 is disposed in the dielectric layer 511 and is electrically connected to the active device 50. In the embodiment, the wire 512 contacts the active device 50.

Figure 42:
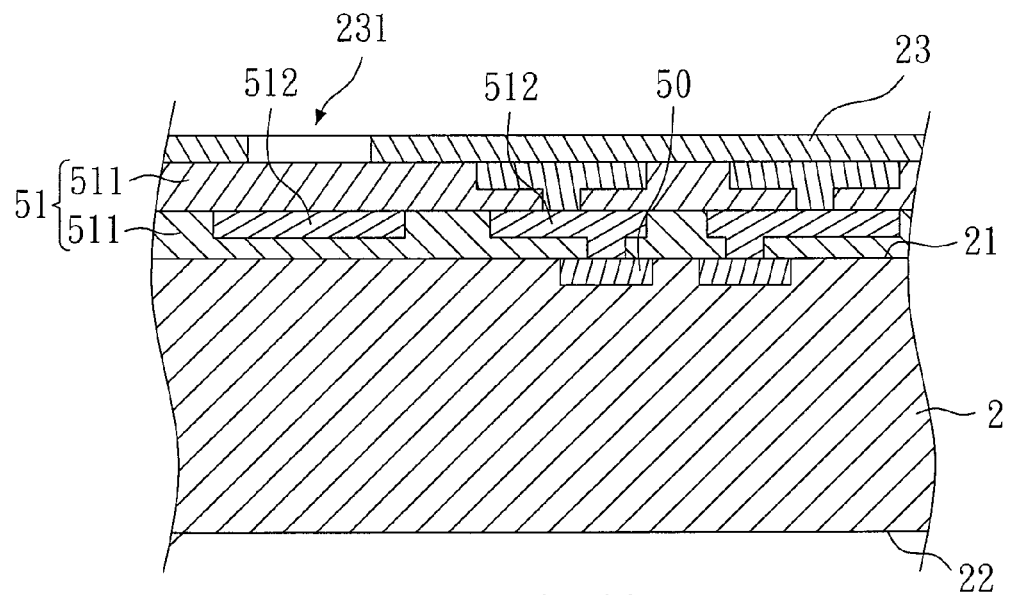

Referring to FIG. 42, a first photo resist layer 23 is formed on the wiring layers 51, and a first opening 231 is formed on the first photo resist layer 23. In the embodiment, the first opening 231 is circular from the top view. It is understood that the first opening 231 may be square, rectangular, hexagonal or other shape from the top view.

Figure 43:
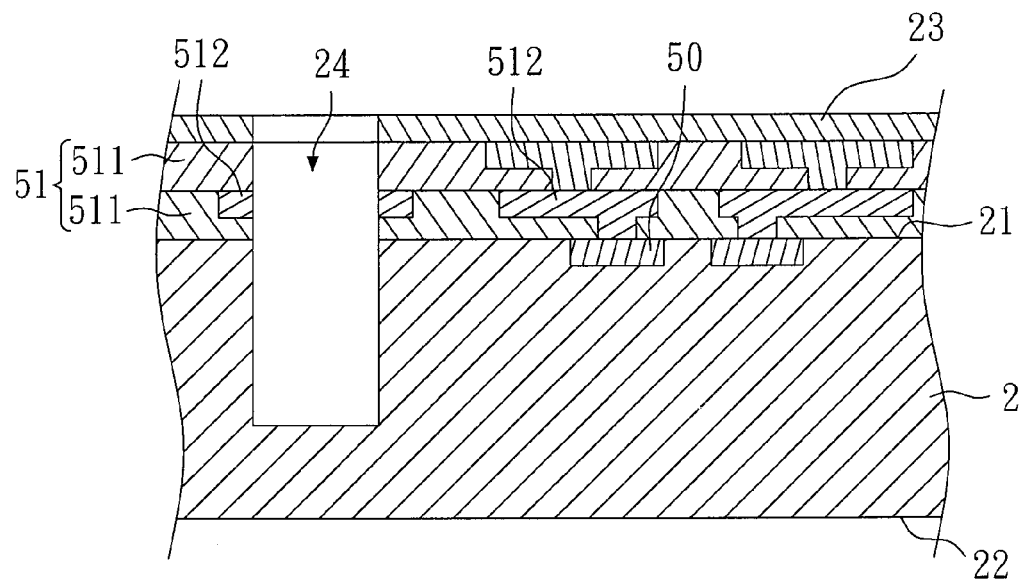

Referring to FIG. 43, a groove 24 is formed in the wiring layers 51 and the semiconductor substrate 2 according to the first opening 231 by etching or other methods, and the groove 24 penetrates the wiring layers 51 but does not entirely penetrate through the semiconductor substrate 2. In the embodiment, the groove 24 penetrates the wire 512. Afterward, the first photo resist layer 23 is removed.

Figure 44:
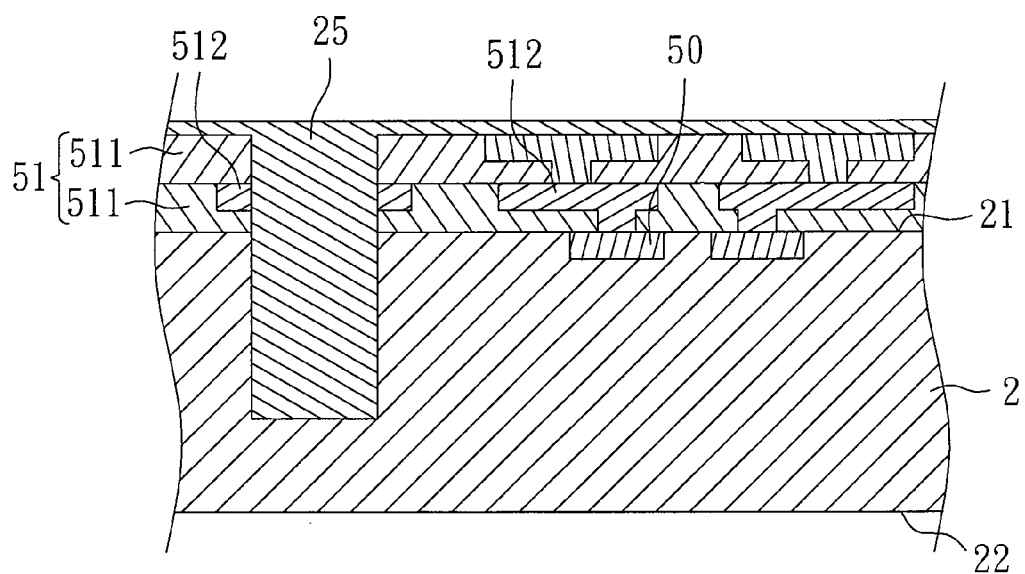
Figure 45:
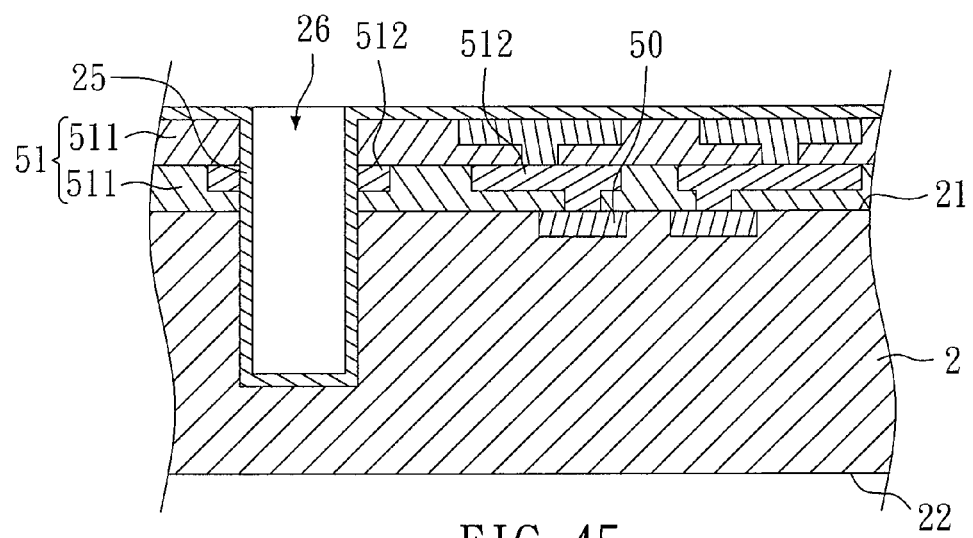

Referring to FIG. 44, the groove 24 is filled with a conductive metal 25. In the embodiment, the material of the conductive metal 25 is copper, and the conductive metal 25 fills up the groove 24 by electroplating. It is understood that the conductive metal 25 may not fill up the groove 24, and forms a central groove 26, that is, the conductive metal 25 is formed on the side wall of the groove 24 only, as shown in FIG. 45.

Figure 46:
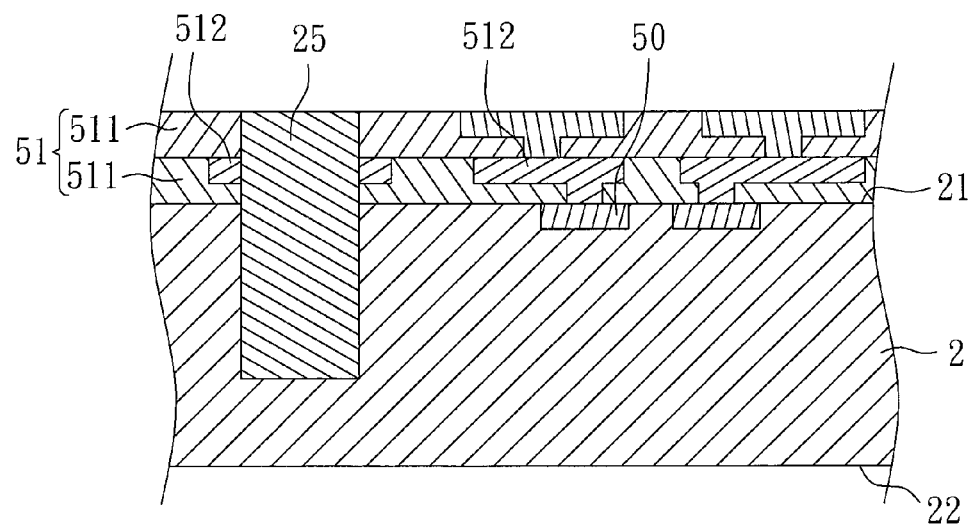
Figure 47:
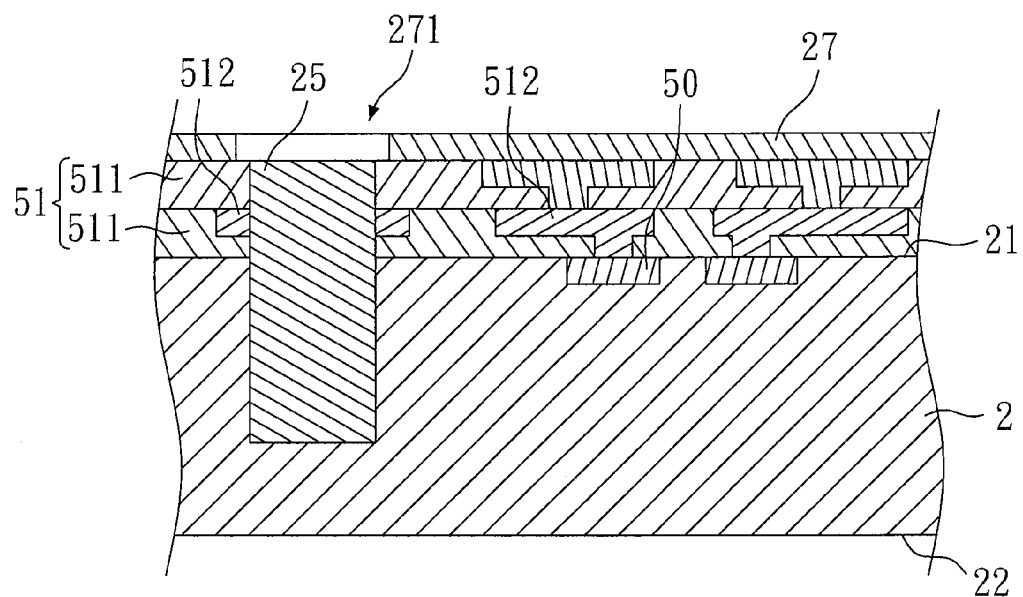
Figure 48:
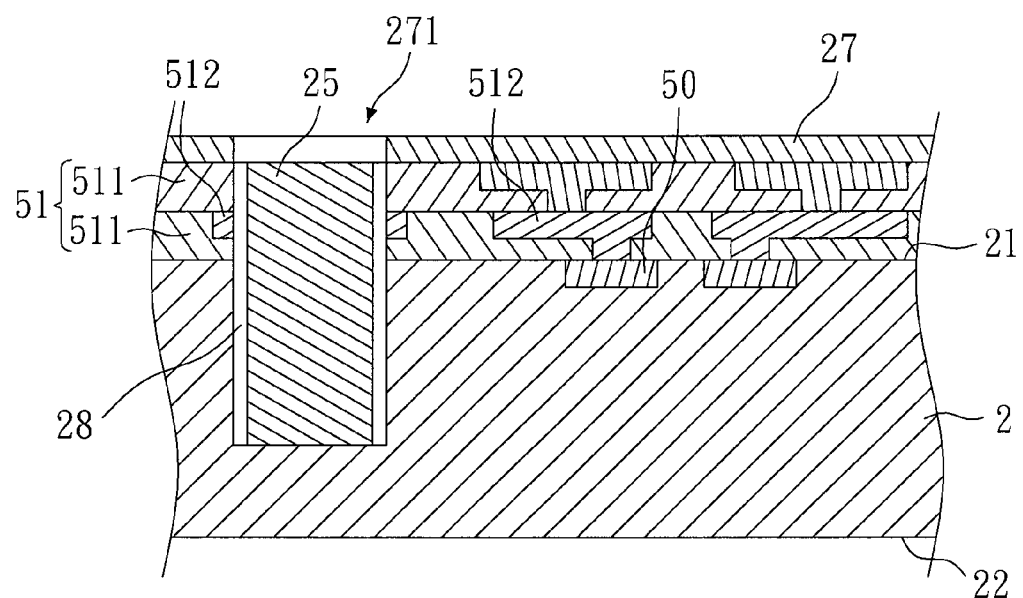

Referring to FIG. 46, the conductive metal 25 which is outside the groove 24 is removed by etching or grinding so as to expose the wiring layers 51. Then, referring to FIGS. 47 to 48, part of the semiconductor substrate 2 and the wiring layers 51 which surround the conductive metal 25 is removed, and the conductive metal 25 substantially intact thereby forming an accommodating space 28 surrounding the conductive metal 25. In the embodiment, the accommodating space 28 is formed by the following methods. Referring to FIG. 47, first, a second photo resist layer 27 is formed on the first surface 21 of the semiconductor substrate 2. A second opening 271 is then formed on the second photo resist layer 27, and is at a position corresponding to the groove 24. The second opening 271 is larger than the first opening 231 (FIG. 42) so as to expose the conductive metal 25. In the embodiment, the second opening 271 is circular and has a central axis, the groove 24 is circular and has a central axis, and the central axes of the second opening 271 and the groove 24 are the same, that is, the central axis of the second opening 271 is the central axis of the groove 24. It is understood that the central axes of the second opening 271 and the groove 24 may not be the same, but the conductive metal 25 must be exposed. Then, referring to FIG. 48, part of the semiconductor substrate 2 and the wiring layers 51 which surrounds the conductive metal 25 is removed by etching or other methods, and the conductive metal 25 is maintained so as to form an accommodating space 28 between the conductive metal 25 and the wiring layers 51 and the semiconductor substrate 2. The accommodating space 28 surrounds the conductive metal 25. The second photo resist layer 27 is then removed.

Figure 49:
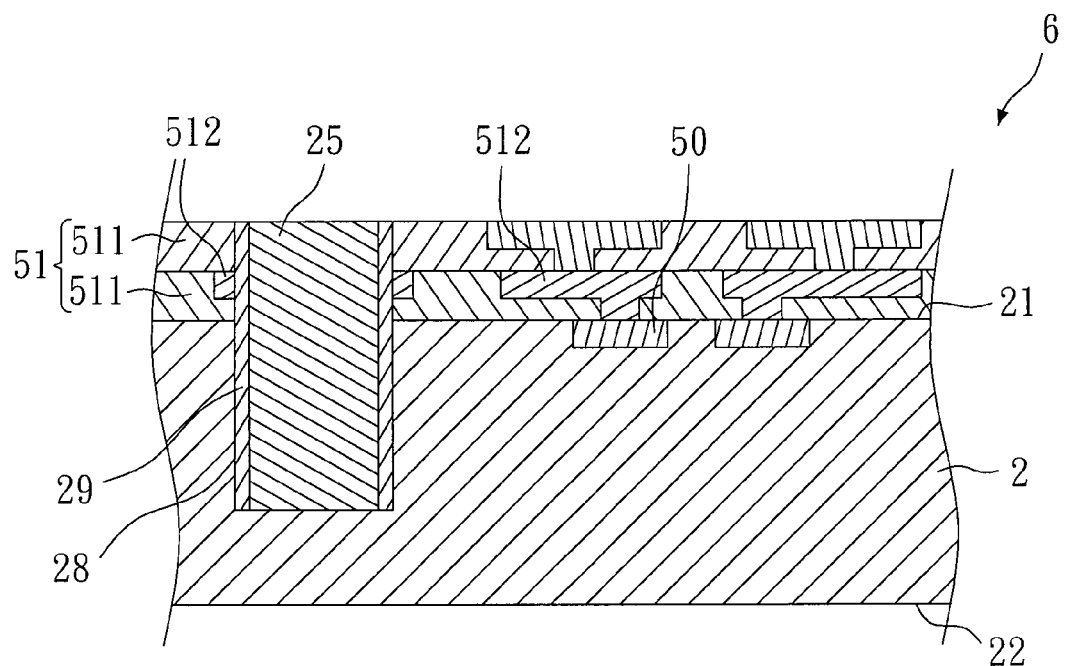

Referring to FIG. 49, an insulating material is formed in the accommodating space 28, so as to form a semiconductor device 6. In the embodiment, the insulating material is polymer 29. However, the insulating material may be silicon dioxide or other material with a property of insulation. In the present invention, the method for forming the polymer 29 in the accommodating space 28 includes but is not limited to the above-mentioned three methods.

Figure 50:
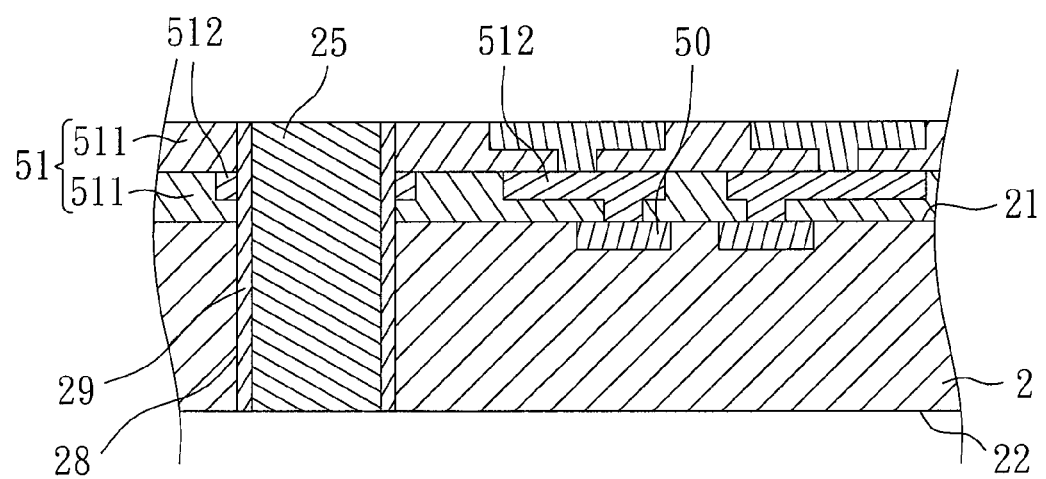

Preferably, referring to FIG. 50, part of the second surface 22 of the semiconductor substrate 2 is removed by etching or grinding so as to expose the conductive metal 25 and the insulating material (the polymer 29).

Figure 51:
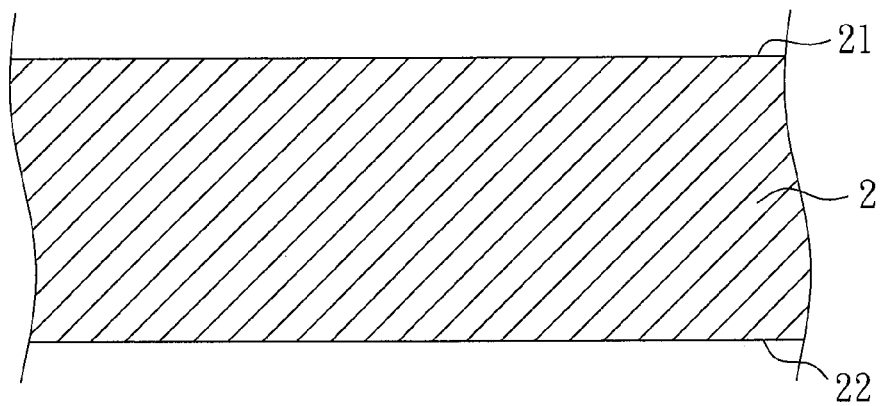
FIGS. 51 to 61 are schematic views of the method for forming a semiconductor device according to the fifth embodiment of the present invention.

FIGS. 51 to 61 show the schematic views of the method for forming a semiconductor device according to the fifth embodiment of the present invention. Referring to FIG. 51, a semiconductor substrate 2 is provided. The semiconductor substrate 2 has a first surface 21, a second surface 22 and integrated circuits (not shown) therein. The Semiconductor substrate 2 is preferably a semiconductor substrate, such as a bulk silicon substrate, although it may include other semiconductor materials such as group III, group IV, and/or group V elements. Semiconductor devices, such as transistors (not shown), may be formed at the first surface 21 of the semiconductor substrate 2.

Figure 52:
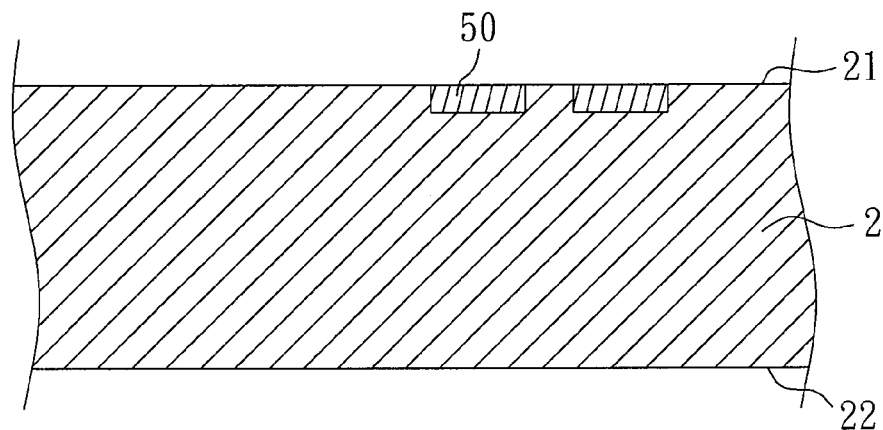

Referring to FIG. 52, a portion of an active device 50 is formed in the semiconductor substrate 2 at a location adjacent to the first surface 21 of the semiconductor substrate 2.

Figure 53:
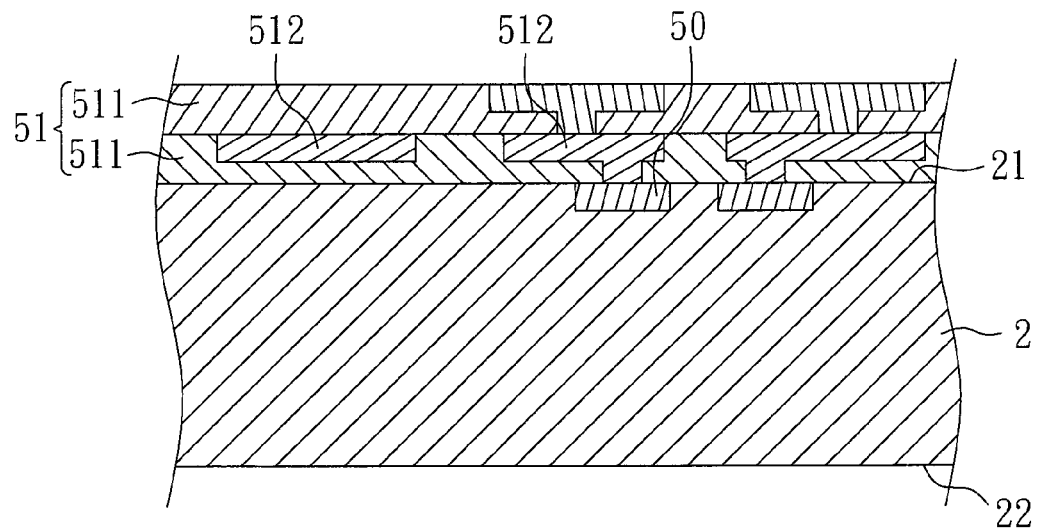

Referring to FIG. 53, one or more wiring layers 51 are formed over the first surface 21 of the semiconductor substrate 2. The wiring layers 51 comprises at least one dielectric layer 511 and at least one wire 512. The wire 512 is disposed in the dielectric layer 511 and is electrically connected to the active device 50. In the embodiment, the wire 512 contacts the active device 50. The wire 512 may be formed of copper or copper alloys, and may be formed using the well-known damascene processes. Further, the wiring layers 51 may include commonly known inter-layer dielectric (ILD) and inter-metal dielectrics (IMDs).

Figure 54:
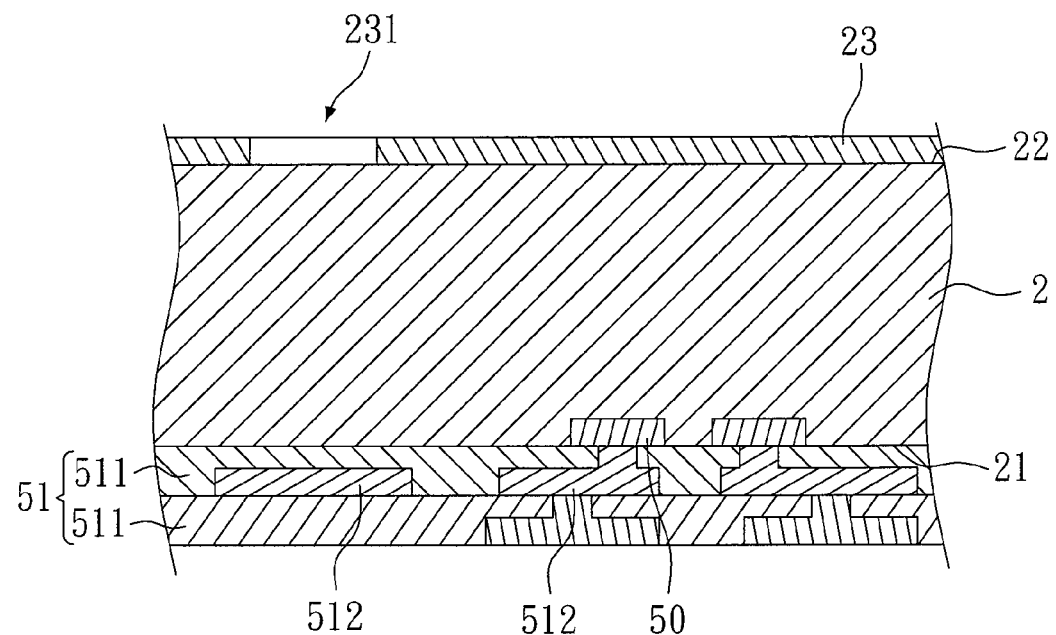

Referring to FIG. 54, a first photo resist layer 23 is formed on the second surface 22 of the semiconductor substrate 2, and a first opening 231 is formed on the first photo resist layer 23. In the embodiment, the first opening 231 is circular from the top view. It is understood that the first opening 231 may be square from the top view.

Figure 55:
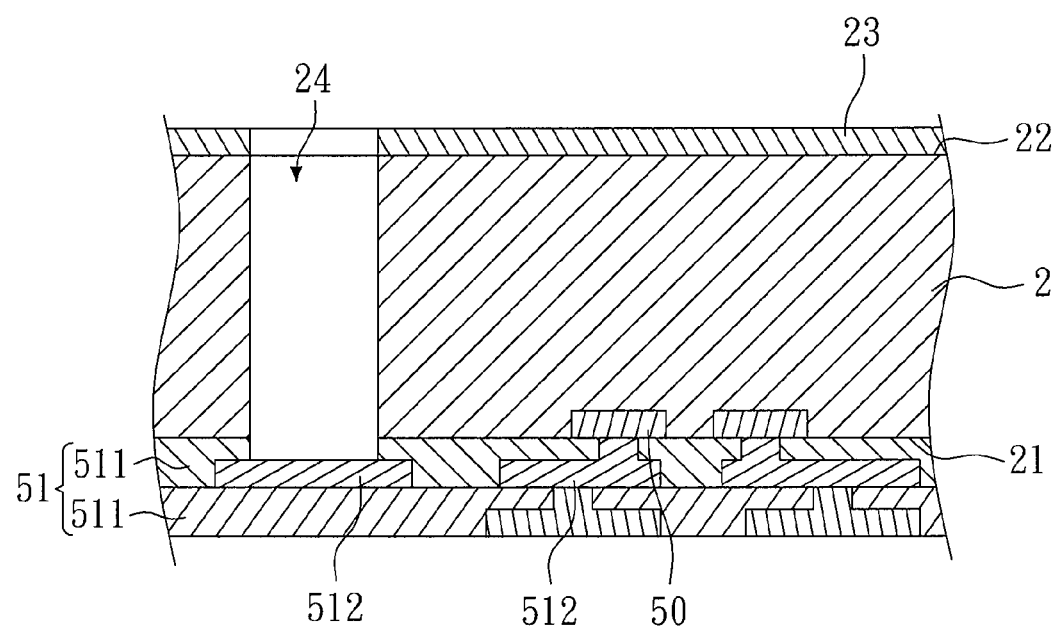

Referring to FIG. 55, a groove 24 is formed on the wiring layers 51 and the semiconductor substrate 2 according to the first opening 231 by etching or other methods, and the groove 24 penetrates the semiconductor substrate 2 but does not entirely penetrate through the wiring layers 51. Preferably, the groove 24 is opened to the second surface 22 of the semiconductor substrate 2 and exposes the wire 512. Afterward, the first photo resist layer 23 is removed.

Figure 56:
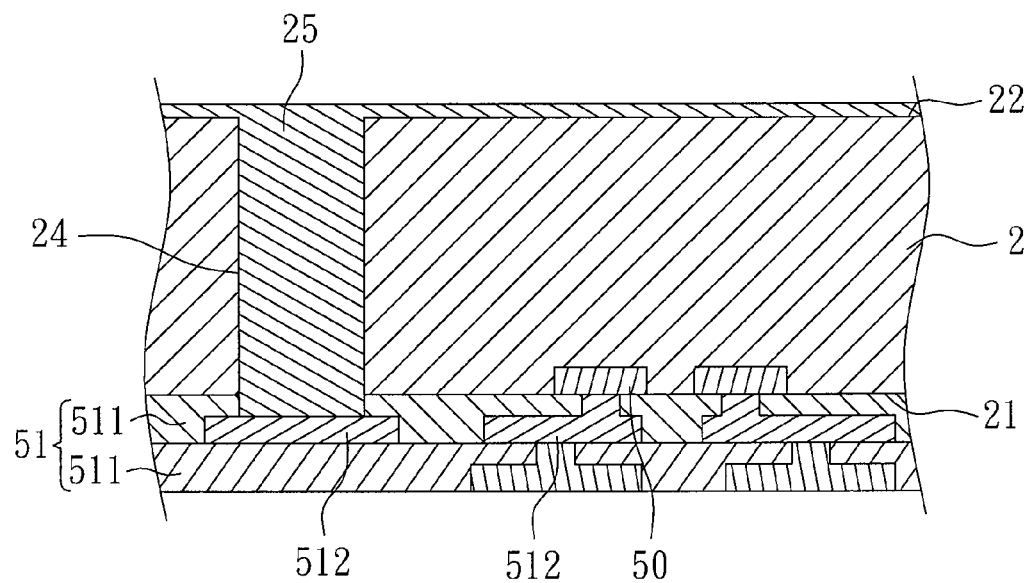
Figure 57:
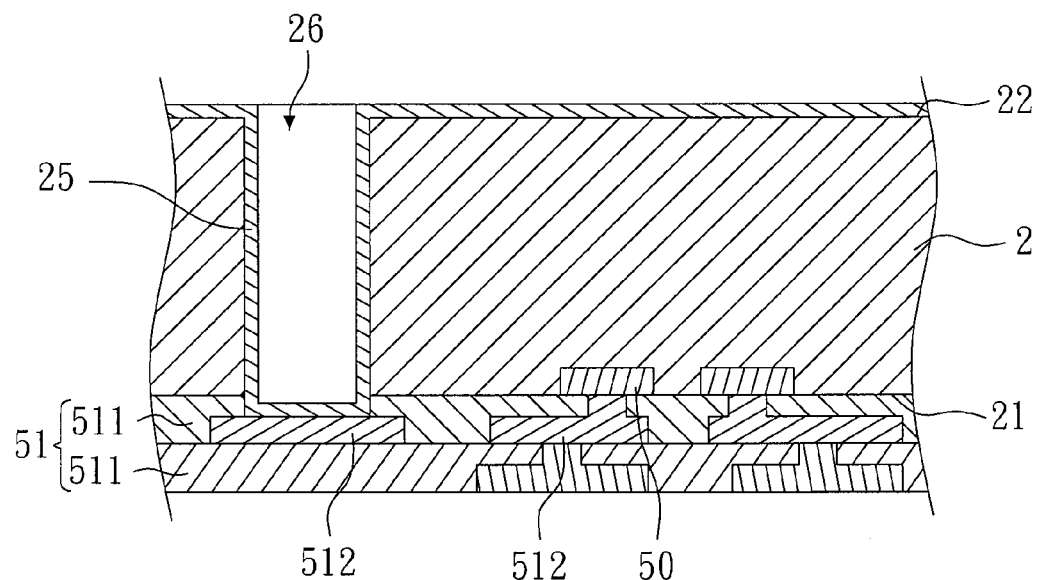

Referring to FIG. 56, the groove 24 is filled with a conductive metal 25. In the embodiment, the material of the conductive metal 25 is copper or copper alloys, and the conductive metal 25 fills up the groove 24 by electroplating. It is understood that the conductive metal 25 may not fill up the groove 24, and forms a central groove 26, that is, the conductive metal 25 is formed on the side wall of the groove 24 only, as shown in FIG. 57. Preferably, the conductive metal 25 contacts the wire 512 of the wiring layers 51 closest to the semiconductor substrate 2.

Figure 58:
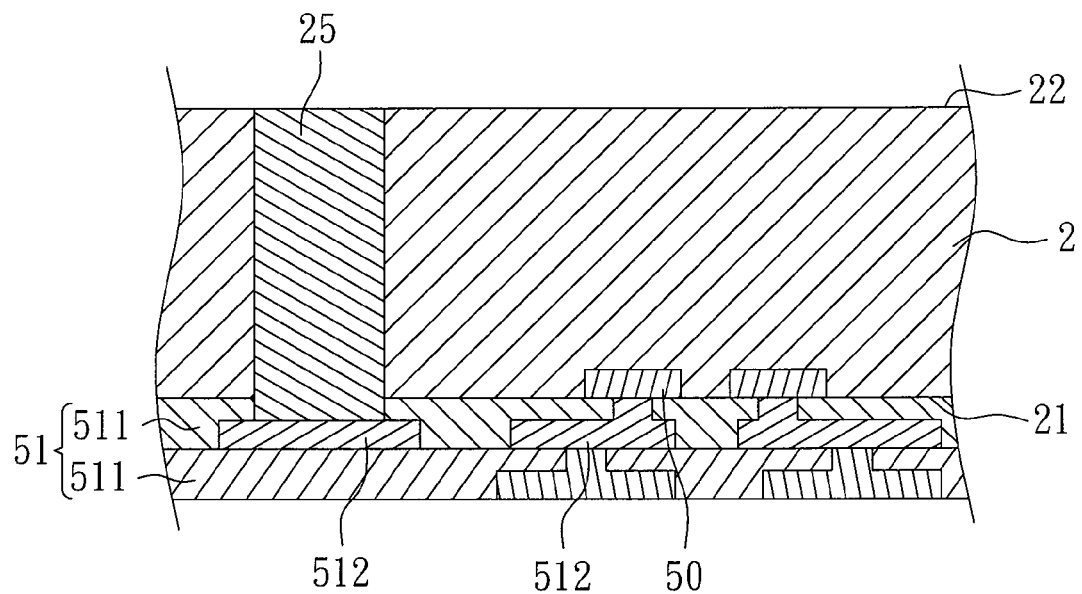
Figure 59:
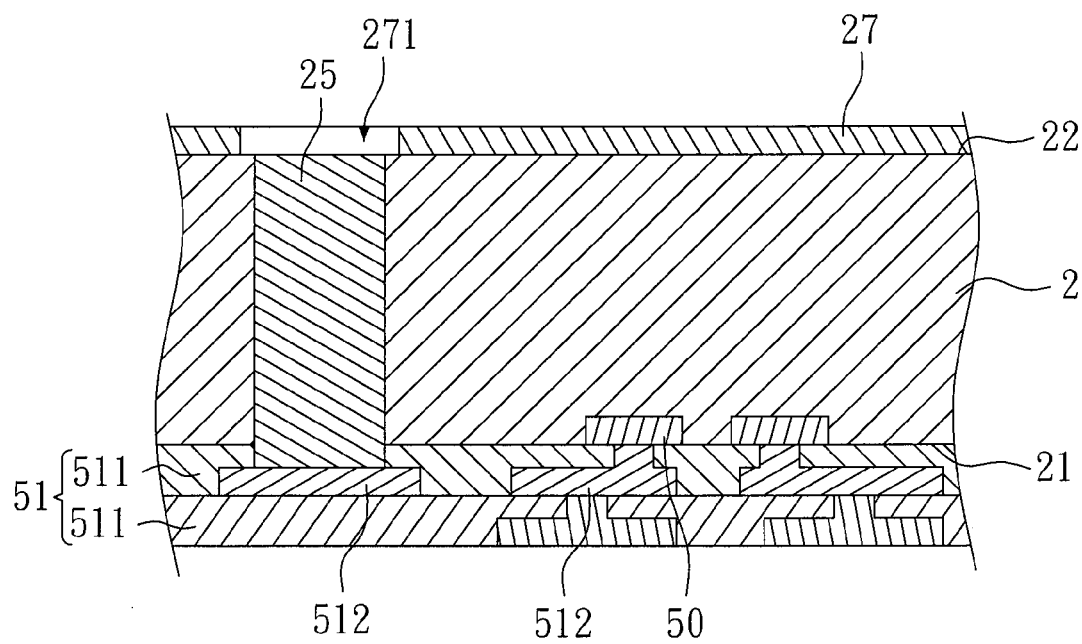
Figure 60:
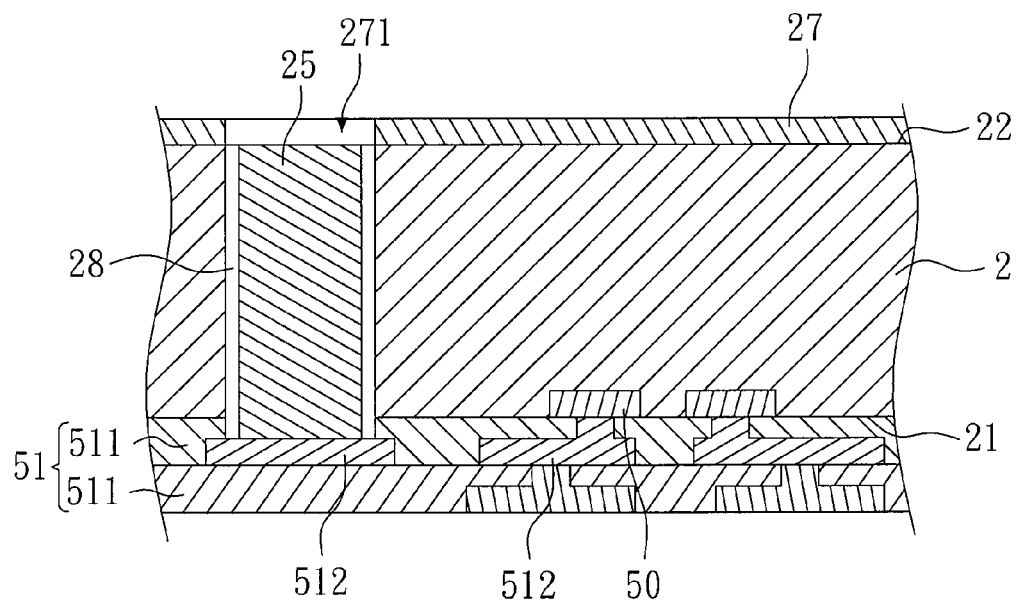

Referring to FIG. 58, the conductive metal 25 which is outside the groove 24 is removed by etching or grinding so as to expose the second surface 22 of the semiconductor substrate 2. Then, referring to FIGS. 59 to 60, part of the semiconductor substrate 2 and the wiring layers 51 which surrounds the conductive metal 25 is removed, and the conductive metal 25 substantially intact thereby forming an accommodating space 28 surrounding the conductive metal 25. In the embodiment, the accommodating space 28 is formed by the following methods. Referring to FIG. 59, first, a second photo resist layer 27 is formed on the second surface 22 of the semiconductor substrate 2. A second opening 271 is then formed on the second photo resist layer 27, and is at a position corresponding to the groove 24. The second opening 271 is larger than the first opening 231 (FIG. 54) so as to expose the conductive metal 25. In the embodiment, the second opening 271 is circular and has a central axis, the groove 24 is circular and has a central axis, and the central axes of the second opening 271 and the groove 24 are the same, that is, the central axis of the second opening 271 is the central axis of the groove 24. It is understood that the central axes of the second opening 271 and the groove 24 may not be the same, but the conductive metal 25 must be exposed. Then, referring to FIG. 60, part of the semiconductor substrate 2 and the wiring layers 51 which surrounds the conductive metal 25 is removed by o etching or other methods, and the conductive metal 25 is maintained so as to form an accommodating space 28 between the conductive metal 25 and the wiring layers 51 and the semiconductor substrate 2. The accommodating space 28 surrounds the conductive metal 25. The second photo resist layer 27 is then removed.

Figure 61:
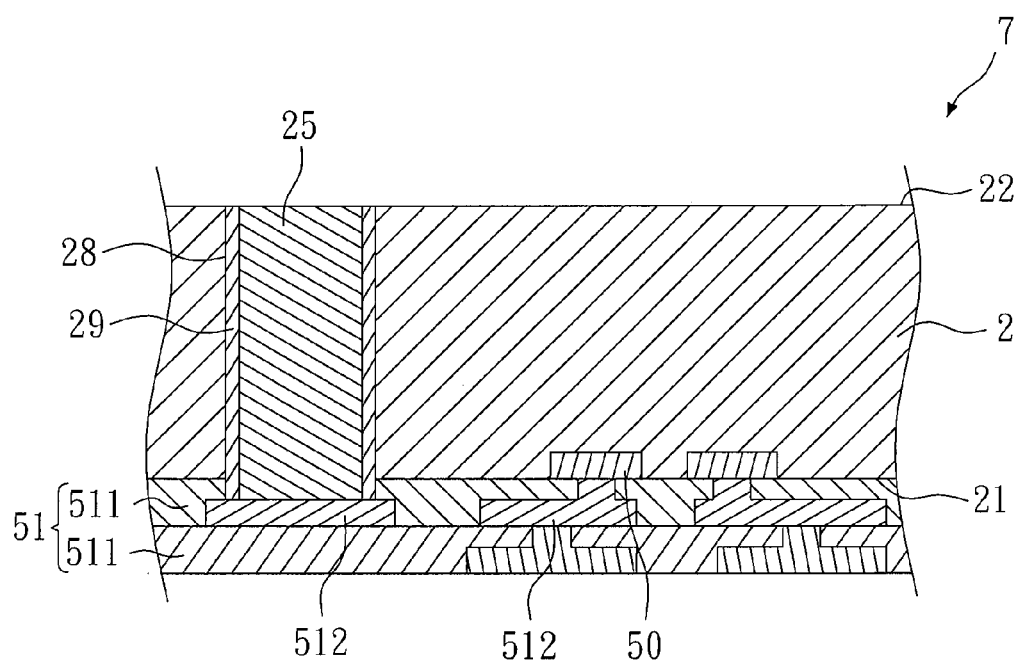

Referring to FIG. 61, an insulating material is formed in the accommodating space 28, so as to form a semiconductor device 7. In the embodiment, the insulating material is polymer 29. However, the insulating material may be formed of commonly used dielectric materials such as silicon nitride, silicon oxide (for example, tetra-ethyl-ortho-silicate (TEOS) oxide), and the like. In the present invention, the method for forming the polymer 29 in the accommodating space 28 includes but is not limited to the above-mentioned three methods.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A method for forming vias in a semiconductor substrate, comprising:
   (a) providing a semiconductor substrate having a first surface and a second surface;
   (b) forming a groove on the semiconductor substrate, wherein the groove does not entirely penetrate through the semiconductor substrate;
   (c) filling the groove with a conductive metal;
   (d) removing part of the semiconductor substrate which surrounds only the conductive metal, wherein the conductive metal is maintained so as to form an accommodating space between the conductive metal and the semiconductor substrate; and
   (e) forming an insulating material in the accommodating space.

2. The method as claimed in claim 1, wherein the conductive metal fills up the groove.

3. The method as claimed in claim 1, wherein the conductive metal does not fill up the groove so as to form a central groove, and the insulating material fills up the accommodating space and the central groove.

4. The method as claimed in claim 1, further comprising a step of removing the conductive metal which is outside the groove after Step (c).

5. The method as claimed in claim 1, wherein Step (d) further comprising:
   (d1) forming a second photo resist layer on the first surface of the semiconductor substrate;
   (d2) forming a second opening on the second photo resist layer, wherein the position of the second opening corresponds to the groove and the second opening is larger than the groove; and
   (d3) removing part of the semiconductor substrate which surrounds the conductive metal, wherein the conductive metal is maintained so as to form an accommodating space between the conductive metal and the semiconductor substrate.

6. The method as claimed in claim 5, wherein a central axis of the second opening is a central axis of the groove.

7. The method as claimed in claim 1, wherein Step (d) further comprising:
   (d1) forming a second photo resist layer on the second surface of the semiconductor substrate;
   (d2) forming a second opening on the second photo resist layer, wherein the position of the second opening corresponds to the groove and the second opening is larger than the groove; and
   (d3) removing part of the semiconductor substrate which surrounds the conductive metal, wherein the conductive metal is maintained so as to form an accommodating space between the conductive metal and the semiconductor substrate.

8. The method as claimed in claim 7, wherein a central axis of the second opening is a central axis of the groove.

9. The method as claimed in claim 1, wherein the insulating material is polymer.

10. The method as claimed in claim 9, wherein Step (e) further comprising:
    (e1) dispersing the polymer at a position corresponding to the accommodating space; and
    (e2) sucking the polymer into the accommodating space by vacuuming.

11. The method as claimed in claim 9, wherein Step (e) further comprising:
    (e1) forming a plurality of vents to connect the accommodating space to the second surface of the semiconductor substrate;
    (e2) dispersing the polymer at a position corresponding to the accommodating space; and
    (e3) filling the accommodating space and the vents with the polymer.

12. The method as claimed in claim 9, wherein the polymer is atomized and deposited in the accommodating space by spray coating.

13. The method as claimed in claim 1, further comprising the steps of:
    (f) forming a portion of an active device in the semiconductor substrate; and
    (g) forming one or more wiring layers over the first surface of the semiconductor substrate, wherein a wire of the one or more wiring layers closest to the semiconductor substrate contacts a top surface of the conductive metal.

14. The method as claimed in claim 13, wherein the conductive metal fills up the groove.

15. The method as claimed in claim 13, wherein the conductive metal does not fill up the groove so as to form a central groove, and the insulating material fills up the accommodating space and the central groove.

16. The method as claimed in claim 13, wherein Step (d) further comprising:
    (d1) forming a second photo resist layer on the first surface of the semiconductor substrate;
    (d2) forming a second opening on the second photo resist layer, wherein the position of the second opening corresponds to the groove and the second opening is larger than the groove; and
    (d3) removing part of the semiconductor substrate which surrounds the conductive metal, wherein the conductive metal is maintained so as to form an accommodating space between the conductive metal and the semiconductor substrate.

17. The method as claimed in claim 16, wherein a central axis of the second opening is a central axis of the groove.

18. The method as claimed in claim 13, wherein the insulating material is polymer.

19. The method as claimed in claim 13, further comprising a step of removing part of the second surface of the semiconductor substrate to expose the conductive metal and the insulating material.

20. A method for forming a semiconductor device, comprising:
(a) providing a semiconductor substrate having a first surface and a second surface;
(b) forming a portion of an active device in the semiconductor substrate at a location adjacent to the first surface of the semiconductor substrate;
(c) forming one or more wiring layers over the first surface of the semiconductor substrate after step (b);
(d) forming a groove in the semiconductor substrate after step (c);
(e) filling the groove with a conductive metal;
(f) removing part of the wiring layers and the semiconductor substrate which surrounds only the conductive metal while leaving the conductive metal substantially intact thereby forming an accommodating space surrounding the conductive metal; and
(g) forming an insulating material in the accommodating space.

21. The method as claimed in claim 20, wherein Step (f) further comprising:
(f1) forming a second photo resist layer on the wiring layers;
(f2) forming a second opening on the second photo resist layer, wherein the position of the second opening corresponds to the groove; and
(f3) removing part of the wiring layers and the semiconductor substrate which surrounds the conductive metal, wherein the conductive metal is maintained so as to form an accommodating space between the conductive metal and the wiring layers and the semiconductor substrate.

22. The method as claimed in claim 21, wherein the second opening is larger than the groove, and a central axis of the second opening is a central axis of the groove.

23. The method as claimed in claim 20, wherein the groove penetrates the semiconductor substrate but does not entirely penetrate through the wiring layers, and the groove is opened to the second surface of the semiconductor substrate and exposes the wire.

24. The method as claimed in claim 23, wherein Step (f) further comprising:
(f1) forming a second photo resist layer on the second surface of the semiconductor substrate;
(f2) forming a second opening on the second photo resist layer, wherein the position of the second opening corresponds to the groove and the second opening is larger than the groove; and
(f3) removing part of the wiring layers and the semiconductor substrate which surrounds the conductive metal, wherein the conductive metal is maintained so as to form an accommodating space between the conductive metal and the wiring layers and the semiconductor substrate.

25. The method as claimed in claim 24, wherein, and a central axis of the second opening is a central axis of the groove.

26. The method as claimed in claim 23, wherein the conductive metal contacts the wire.

27. The method as claimed in claim 20, wherein the conductive metal fills up the groove.

28. The method as claimed in claim 20, wherein the conductive metal does not fill up the groove so as to form a central groove, and the insulating material fills up the accommodating space and the central groove.

29. The method as claimed in claim 20, wherein the insulating material is polymer.

30. The method as claimed in claim 20, further comprising a step of removing part of the second surface of the semiconductor substrate to expose the conductive metal and the insulating material.

* * * * *